(12) United States Patent
Lee et al.

(10) Patent No.: US 12,051,455 B2
(45) Date of Patent: Jul. 30, 2024

(54) VARIABLE RESISTANCE MEMORY DEVICE

(71) Applicant: Samsung Electronics Co., Ltd., Suwon-si (KR)

(72) Inventors: Yong Jae Lee, Seongnam-si (KR); Jihun Byun, Yongin-si (KR)

(73) Assignee: Samsung Electronics Co., Ltd., Gyconggi-do (KR)

( * ) Notice: Subject to any disclaimer, the term of this patent is extended or adjusted under 35 U.S.C. 154(b) by 128 days.

(21) Appl. No.: 17/845,274

(22) Filed: Jun. 21, 2022

(65) Prior Publication Data

US 2023/0114539 A1    Apr. 13, 2023

(30) Foreign Application Priority Data

Oct. 7, 2021 (KR) .................. 10-2021-0133448

(51) Int. Cl.
*G11C 11/16* (2006.01)
*H10B 61/00* (2023.01)
(Continued)

(52) U.S. Cl.
CPC ........ *G11C 11/161* (2013.01); *G11C 11/1655* (2013.01); *G11C 11/1657* (2013.01);
(Continued)

(58) Field of Classification Search
CPC .............. G11C 11/161; G11C 11/1655; G11C 11/1657; G11C 11/1673; G11C 11/1675;
(Continued)

(56) References Cited

U.S. PATENT DOCUMENTS 7,799,643 B2   9/2010  Kang et al.
8,587,042 B2 * 11/2013 Kajiyama ........... H01L 27/0207
                                                   257/295
(Continued)

FOREIGN PATENT DOCUMENTS

KR        10-0843716 B1     7/2008

OTHER PUBLICATIONS

Yeongkyo Seo, et al., "Area-Efficient SOT-MRAM with a Schottky Diode," IEEE Electron Device Letters, vol. 37, Issue 8, Jun. 9, 2016.
(Continued)

*Primary Examiner* — Allison Bernstein
(74) *Attorney, Agent, or Firm* — Harness, Dickey & Pierce, P.L.C.

(57) ABSTRACT

A variable resistance memory device includes active regions apart from each other, common bit line contacts in the active regions, first active source contacts on first active regions near one edge of each of the common bit line contacts, second active source contacts on second active regions near another edge of each of the common bit line contacts, word lines between the first active source contacts and the common bit line contacts and between the common bit line contacts and the second active source contacts, bit lines on the common bit line contacts, variable resistance layers connected to the second active source contacts, the word lines, and the bit lines, spin-orbit torque (SOT) layers connected to the first active source contacts on the variable resistance layers, the word lines, and the bit lines, source line contacts on the SOT layers, and source lines connected to the source line contacts.

20 Claims, 24 Drawing Sheets

(51) Int. Cl.
*H10N 50/10* (2023.01)
*H10N 50/80* (2023.01)
(52) U.S. Cl.
CPC ...... *G11C 11/1673* (2013.01); *G11C 11/1675* (2013.01); *H10B 61/22* (2023.02); *H10N 50/10* (2023.02); *H10N 50/80* (2023.02)
(58) Field of Classification Search
CPC ..... G11C 11/18; G11C 11/1659; H10B 61/22; H10B 61/00; H10N 50/10; H10N 50/80
See application file for complete search history.

(56) References Cited

U.S. PATENT DOCUMENTS

| | | | |
|---|---|---|---|
| 8,711,602 B2* | 4/2014 | Watanabe | H10N 70/253 |
| | | | 365/158 |
| 9,542,987 B2 | 1/2017 | Naik et al. | |
| 9,620,188 B2 | 4/2017 | Manipatruni et al. | |
| 10,468,103 B2 | 11/2019 | Kim et al. | |
| 10,693,058 B2 | 6/2020 | Lee | |
| 11,004,900 B2 | 5/2021 | Shin et al. | |
| 11,411,047 B2* | 8/2022 | Manipatruni | H10B 61/22 |
| 11,716,859 B2* | 8/2023 | Diaz | H10B 61/22 |
| | | | 257/421 |
| 2020/0136018 A1 | 4/2020 | Ying et al. | |
| 2021/0134339 A1 | 5/2021 | Song et al. | |

OTHER PUBLICATIONS

Rahul Mishra et al., "Shared-Write-Channel-Based Device for High-Density Spin-Orbit-Torque Magnetic Random-Access Memory," Physical Review Applied 15, Feb. 25, 2021.

Karim Ali Ahmed et al., "Area-Efficient Multibit-per-Cell Architecture for Spin-Orbit-Torque Magnetic Random-Access Memory With Dedicated Diodes," IEEE Magnetics Letters, vol. 9, Apr. 20, 2018.

A. Manchon et al., "Current-induced spin-orbit torques in ferromagnetic and antiferromagnetic systems," Apr. 24, 2019.

K. Garello et al., "Manufacturable 300mm platform solution for Field-Free Switching SOT-MRAM," 2019 Symposium on VLSI Technology, IEEE, Jun. 9-14, 2019.

Bernard Dieny et al., "Introduction to Magnetic Random-Access Memory," IEEE Press, pp. 106-107, Nov. 26, 2016.

* cited by examiner

VARIABLE RESISTANCE MEMORY DEVICE

CROSS-REFERENCE TO RELATED APPLICATION

This application is based on and claims priority under 35 U.S.C. § 119 to Korean Patent Application No. 10-2021-0133448, filed on Oct. 7, 2021, in the Korean Intellectual Property Office, the disclosure of which is incorporated by reference herein in its entirety.

BACKGROUND

The inventive concepts relate to a memory device, and more particularly, to a variable resistance memory device.

A variable resistance memory device has been considered with keen interest to replace a flash memory device due to use of current transfer characteristics of a variable resistance layer in response to an applied voltage. A representative example of the variable resistance memory device may include a magnetic random access memory (MRAM) device (or a magneto-resistive memory device). With increasing demand for high-performance and/or compact electronics, the variable resistance memory device may benefit from a high integration of memory cells.

SUMMARY

The inventive concepts provide a variable resistance memory device having highly integrated memory cells.

According to an example embodiment of the inventive concepts, there is provided a variable resistance memory device including a plurality of active regions spaced apart from each other in a first direction and a second direction; a plurality of first active source contacts on first ends of the plurality of active regions; a plurality of second active source contacts on second ends of the plurality of active regions; a plurality of bit lines extending in the second direction, the plurality of bit lines including at least a first bit line between a row of the plurality of first active source contacts and a row of the plurality of second active source contacts; a plurality of common bit line contacts electrically connecting central portions or central edges of the plurality of active regions with the plurality of bit lines; a plurality of word lines extending in the first direction, the plurality of word lines including at least a first word line between a column of the plurality of first active source contacts and a column of the plurality of common bit line contacts and at least a second word line between the column of the plurality of common bit line contacts and a column of the plurality of the second active source contacts; a plurality of variable resistance layers over the plurality of active regions, the plurality of word lines, and the plurality of bit lines, the plurality of variable resistance layers electrically connected to the plurality of second active source contacts; a plurality of spin-orbit torque (SOT) layers on the plurality of variable resistance layers and over the plurality of active regions, the plurality of word lines, and the plurality of bit lines, the plurality of SOT layers electrically connected to the plurality of first active source contacts; a plurality of source lines extending in the second direction; and a plurality of source line contacts electrically connecting the plurality of SOT layers and the plurality of source lines.

According to an example embodiment of the inventive concepts, there is provided a variable resistance memory device a plurality of active regions spaced apart from each other in a first direction and a second direction; a plurality of first active source contacts on first ends of the plurality of active regions; a plurality of second active source contacts on second ends of the plurality of active regions; a plurality of bit lines extending in the second direction, the plurality of bit lines including at least a first bit line between a row of the plurality of first active source contacts and a row of the plurality of second active source contacts; a plurality of common bit line contacts electrically connecting central portions of the plurality of active regions with the plurality of bit lines; a plurality of word lines extending in the first direction, the plurality of word lines including at least a first word line between a column of the plurality of first active source contacts and a column of the plurality of common bit line contacts and at least a second word line between the column of the plurality of common bit line contacts and a column of the plurality of second active source contacts; a plurality of first middle connection contacts; first wiring structures electrically connecting the plurality of first active source contacts and the plurality of first middle connection contacts such that electrical paths between the plurality of first active source contacts and the plurality of first middle connection contacts are shifted by the first wiring structures; a plurality of second middle connection contacts; second wiring structures electrically connecting the plurality of second active source contacts and the plurality of second middle connection contacts such that electrical paths between the plurality of second active source contacts and the plurality of second middle connection contacts are shifted by the second wiring structures; a plurality of variable resistance layers over the plurality of active regions, the plurality of word lines, and the plurality of bit lines, the plurality of variable resistance layers having lower portions electrically connected to the plurality of second middle connection contacts; a plurality of spin-orbit torque (SOT) layers on the plurality of variable resistance layers and over the plurality of active regions, the plurality of word lines, and the plurality of bit lines, the plurality of SOT layers having lower portions electrically connected to the plurality of first middle connection contacts; a plurality of source lines extending in the second direction; and plurality of source line contacts electrically connecting the plurality of SOT layers and the plurality of source lines.

According to example embodiment of the inventive concepts, there is provided a variable resistance memory device including a plurality of word lines extending in a first direction; a plurality of bit lines extending in a second direction; plurality of source lines extending in the second direction; and a plurality of memory cells spaced apart from each other in the first direction and the second direction. Each of the plurality of memory cells may comprise an active region, a common bit line contact in a central portion of the active region, the common bit line electrically connecting the active region to a bit line of the plurality of bit lines, a first active source contact on the active region such that, in a top view, a first word line, of the plurality of word lines, is between the first active source contact and the common bit line contact, a second active source contact on a second end of the active region such that, in the top view, a second word line, of the plurality of word lines, is between the second active source contact and the common bit line contact, a variable resistance layer over the active region, the first and second word lines, and the bit line, the variable resistance layer electrically connected to the second active source contact, a spin-orbit torque (SOT) layer on the variable resistance layer and over the active region, the first and second of word lines, and the bit line, the SOT layer electrically connected to the first active source contact, and a source line contact electrically connecting a source line, of the plurality of source lines, and the SOT layer. The first active source contact may be between the second active source contacts of the memory cells adjacent to each other in the second direction, and the second active source contact may be between the first source contacts of the memory cells adjacent to each other in the second direction.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION OF THE EMBODIMENTS

Example embodiments will now be described in detail with reference to the accompanying drawings. The accompanying drawings are intended to depict example embodiments of the inventive concepts and should not be interpreted to limit the intended scope of the claims. The accompanying drawings are not to be considered as drawn to scale unless explicitly noted. Any one of the embodiments may be implemented or at least one of the embodiments may be combined with one another. The inventive concepts are not limited to each of the example embodiments described below.

It will be understood that, although the terms "first", "second", "third", and so on may be used herein to describe various elements, components, regions, layers and/or sections. These terms are used to distinguish one element, component, region, layer or section from another element, component, region, layer, or section. These elements, components, regions, layers and/or sections should not be otherwise limited by these terms. Thus, a first element, component, region, layer, or section described below could be termed a second element, component, region, layer, or section, without departing from the spirit and scope of the present disclosure.

Spatially relative terms, such as "over," "under" and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, the device may be otherwise oriented (for example, rotated 90 degrees or at other orientations) and the spatially relative descriptors used herein should be interpreted accordingly.

Figure 1:
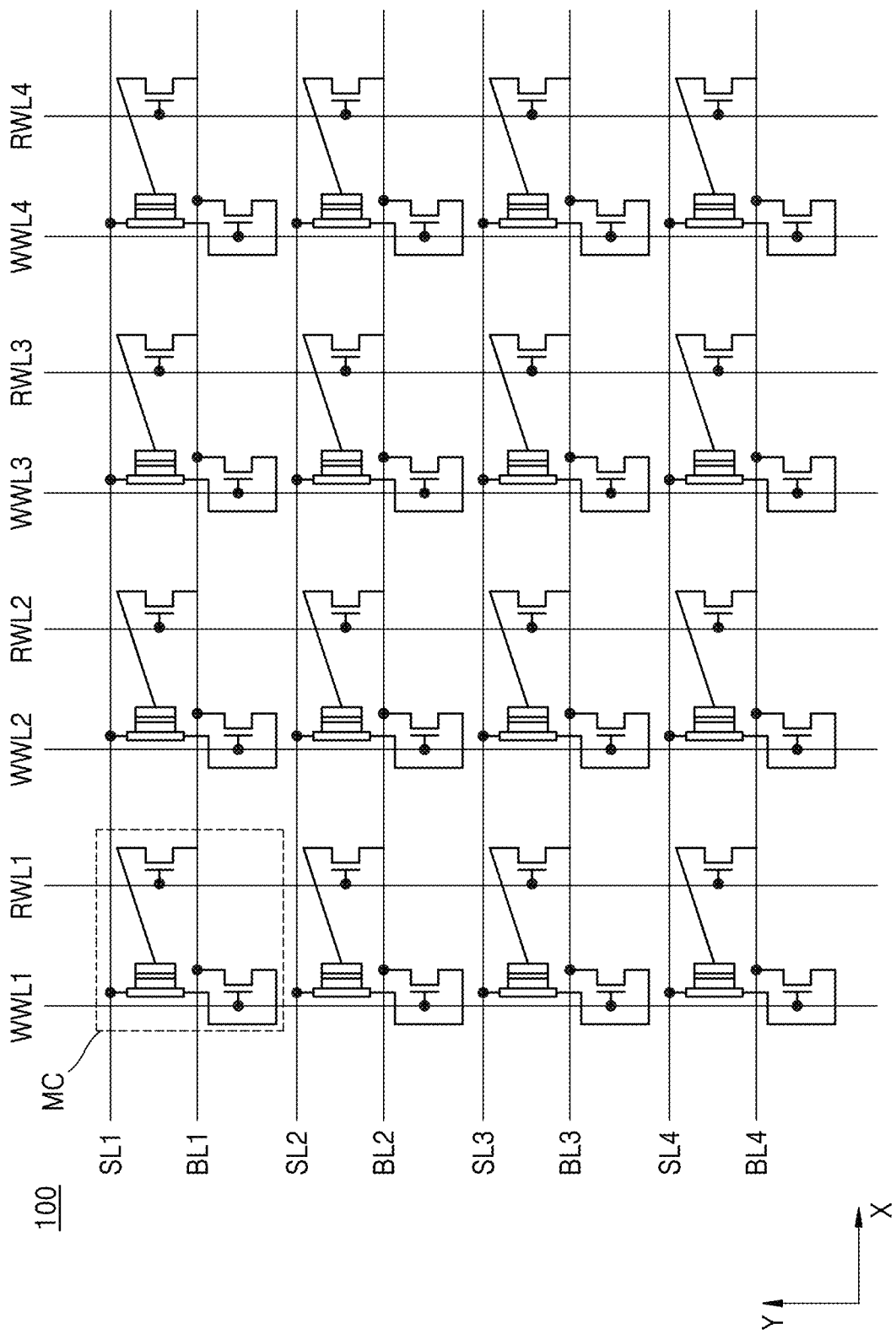
FIG. 1 is a circuit diagram of a variable resistance memory device according to some embodiments.
Figure 2:
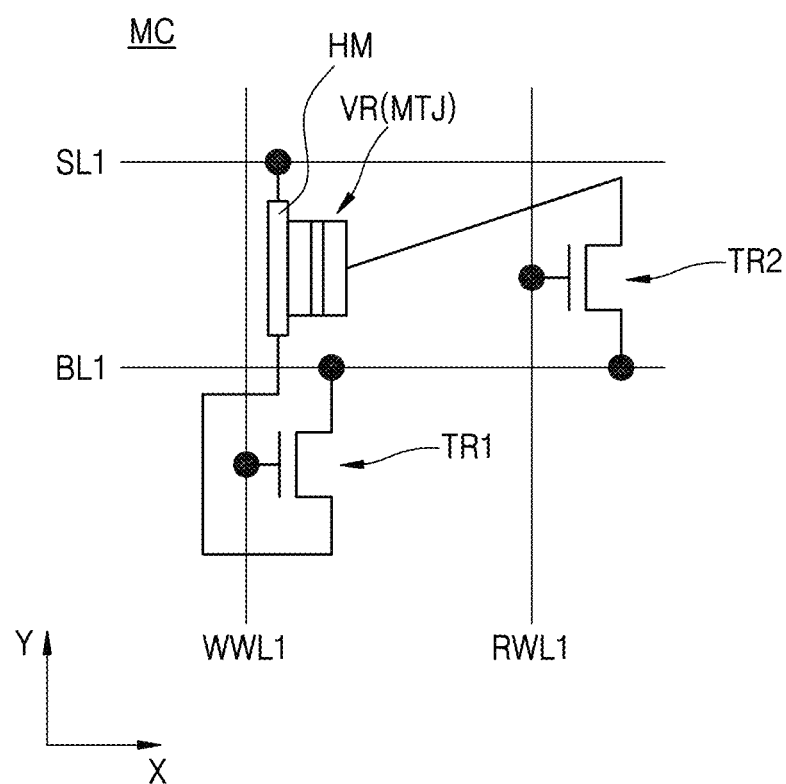
FIG. 2 is a detailed circuit diagram of a memory cell of FIG. 1.

FIG. 1 is a circuit diagram of a variable resistance memory device 100 according to some embodiments, and FIG. 2 is a detailed circuit diagram of a memory cell of FIG. 1.

The variable resistance memory device 100 may include a plurality of memory cells MC, which are arranged in a matrix form. For example, the variable resistance memory device 100 may include a plurality of memory cells MC, which are apart from each other and arranged in a matrix form in a first direction (e.g., a Y direction) and a second direction (e.g., an X direction) that is perpendicular to the first direction (e.g., a Y direction).

The plurality of memory cells MC arranged in the matrix form may be referred to as a memory cell array. As shown in FIG. 2, each of the memory cells MC may include first and second transistors TR1 and TR2 and a variable resistance layer VR.

The variable resistance memory device 100 may include a plurality of word lines (e.g., WWL1 to WWL4 and RWL1 to RWL4), a plurality of source lines (e.g., SL1 to SL4), and a plurality of bit lines (e.g., BL1 to BL4). In FIG. 1, the number of word lines (e.g., WWL1 to WWL4 and RWL1 to RWL4), the number of source lines (e.g., SL1 to SL4), and the number of bit lines (e.g., BL1 to BL4) are taken as examples for brevity. For example, the variable resistance memory device 100 may include more or fewer word lines, source lines, and/or bit lines than are illustrated in FIG. 1.

The word lines WWL1 to WWL4 and RWL1 to RWL4 may extend in the first direction (e.g., the Y direction) and be apart from each other in the second direction (e.g., the X direction). The word lines WWL1 to WWL4 and RWL1 to RWL4 may include write word lines WWL1 to WWL4 and read word lines RWL1 to RWL4. The write word lines WWL1 to WWL4 and the read word lines RWL1 to RWL4 may be word lines that are respectively used for a write operation and a read operation of the variable resistance memory device 100.

The source lines SL1 to SL4 and the bit lines BL1 to BL4 may extend in the second direction (e.g., X direction) and be apart from each other in the first direction (e.g., the Y direction). FIG. 2 illustrates a case in which the memory cell MC is electrically connected to the word lines WWL1 and RWL1 of the word lines WWL1 to WWL4 and RWL1 to RWL4, the source line SL1 of the source lines SL1 to SL4, and the bit line BL1 of the bit lines BL1 to BL4.

The variable resistance layer VR may include a material layer having a variable resistance value. The variable resistance layer VR may have resistance values corresponding to data "0" and "1". For example, the variable resistance layer VR may have a resistance value lower than a predetermined (and/or otherwise determined) reference resistance value and store data "0."

Conversely, the variable resistance layer VR may have a resistance value higher than a predetermined (and/or otherwise determined) reference resistance value and store data "1." Here, data "0" and "1" corresponding to the resistance values may be examples and be inverted values of each other based on the embodiment. In some example embodiments, the resistance value may correspond to an analog value for use, e.g., in analog computers, machine learning models, and/or the like.

According to some example embodiments, the variable resistance layer VR may include a magnetic material. As shown in FIG. 2, the variable resistance layer VR may include a magnetic tunnel junction (MTJ) structure. The variable resistance layer VR may be in contact with a spin-orbit torque (SOT) layer HM. The variable resistance layer VR may be formed on the SOT layer HM.

The variable resistance memory device 100 may perform a memory function by changing a magnetization direction of the magnetic material included in the variable resistance layer VR using an SOT phenomenon. The variable resistance layer VR may include an SOT-type MTJ structure MTJ.

The variable resistance memory device 100 may be and/or include a magnetic RAM (MRAM) device and/or a magneto-resistive memory device. The variable resistance memory device 100 may include an SOT-type MRAM device and/or an SOT-type magneto-resistive memory device. The variable resistance memory device 100 (e.g., the SOT-type magneto-resistive memory device) may have high-speed switching, high durability, and low read confusion characteristics.

As shown in FIG. 2, the variable resistance memory device 100 may be advantageously configured for high integration by sharing one bit line BL1 between two transistors TR1 and TR2 (e.g., the first and second transistors TR1 and TR2) in the memory cell MC. The first transistor TR1 may be electrically connected to the bit line BL1 and the write word line WWL1. For example, the first transistor TR1 may be electrically connected to the SOT layer HM. The second transistor TR2 may be electrically connected to the bit line BL1 and the read word line RWL1. The second transistor TR2 may be electrically connected to the variable resistance layer VR.

In the variable resistance memory device 100, the memory cell MC may include the variable resistance layer VR and the first and second transistors TR1 and TR2. The memory cell MC may include four conductive lines (e.g., the write word line WWL1, the read word line RWL1, the source line SL1, and the bit line BL1) and perform write and read operations by using the four conductive lines.

Because the variable resistance memory device 100 includes the SOT layer HM and the variable resistance layer VR, the variable resistance memory device 100 may use an SOT phenomenon and change a current path during the write and read operations on the memory cell MC.

Hereinafter, a technique of increasing the integration density of the variable resistance memory device 100 by optimizing electrical and physical connection relationships between components included in the memory cell MC of the variable resistance memory device 100, write and read operations on the memory cell MC, and the arrangement of the components included in the memory cell MC will be described in further detail.

Figure 3:
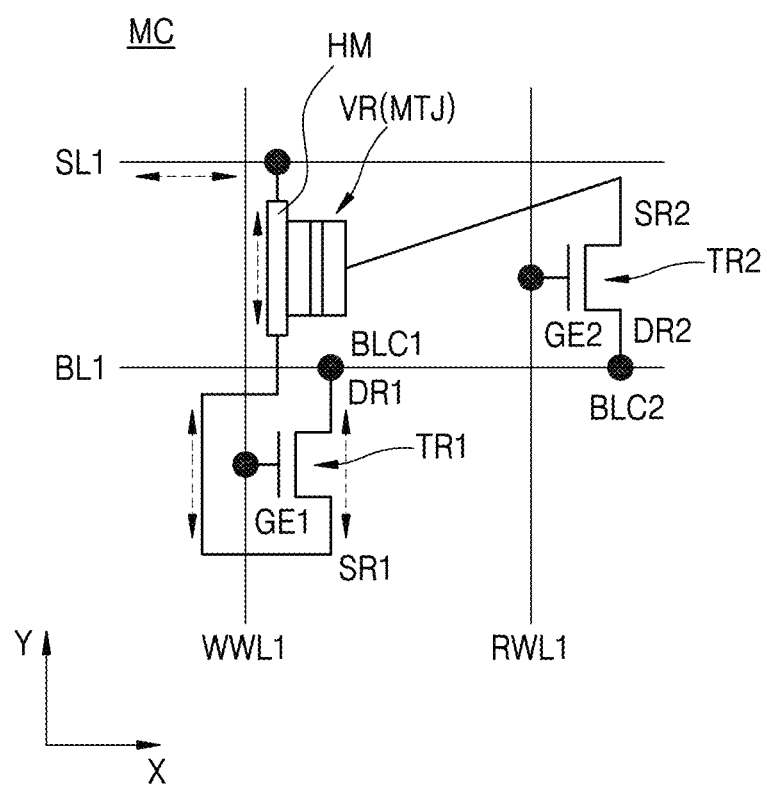
FIGS. 3 and 4 are circuit diagrams of write and read operations performed in a memory cell in the variable resistance memory device of FIGS. 1 and 2.
Figure 4:
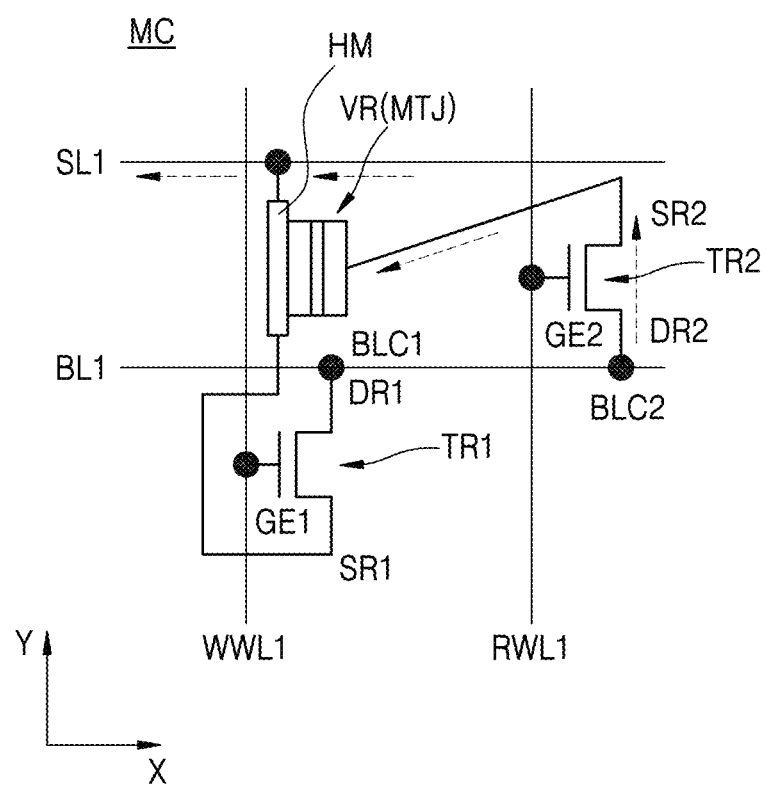

FIGS. 3 and 4 are circuit diagrams of write and read operations on a memory cell in the variable resistance memory device of FIGS. 1 and 2.

As described above, a memory cell MC may include a variable resistance layer VR, first and second transistors TR1 and TR2, a write word line WWL1, a read word line RWL1, a source line SL1, and a bit line BL1.

The first transistor TR1 may include a first source SR1, a first drain DR1, and a first gate GE1. The first gate GE1 may be electrically connected to the write word line WWL1.

The first drain DR1 may be electrically connected to the bit line BL1 through a first bit line contact BLC1. The first source SR1 may be electrically connected to one end of the SOT layer HM. Another end of the SOT layer HM may be electrically connected to the source line SL1 through a source line contact SLC.

The second transistor TR2 may include a second source SR2, a second drain DR2, and a second gate GE2. The second gate GE2 may be electrically connected to the read word line RWL1. The second drain DR2 may be electrically connected to the bit line BL1 through a second bit line contact BLC2. The second source SR2 may be electrically connected to the variable resistance layer VR (e.g., an MTJ structure MTJ). The variable resistance layer VR may be an MTJ structure MTJ of an SOT type, in which a magnetization direction is changed by an SOT phenomena.

In the memory cell MC, the first drain DR1 and the second drain DR2 may constitute a common drain, and/or the first bit line contact BLC1 and the second bit line contact BLC2 may constitute a common bit line contact. In these cases, the memory cell MC may be highly integrated by reducing the size of the memory cell MC.

Each of the first and second transistors TR1 and TR2 may be turned on or off depending on whether a voltage is applied to the write word line WWL1 or the read word line RWL1. As shown in FIG. 3, when the first transistor TR1 is turned on by applying a voltage to the write word line WWL1, current may be supplied among the bit line BL1, the SOT layer HM, and the source line SL1, and thus, data may be written to the variable resistance layer VR.

The write operation may include changing the magnetization direction of the variable resistance layer VR (e.g., the MTJ structure MTJ) by supplying current to the SOT layer HM in a direction from the bit line BL1 toward the source line SL1 or in a direction from the source line SL1 toward the bit line BL1.

As shown in FIG. 4, when the second transistor TR2 is turned on by applying voltage to the read word line RWL1, current may flow between the bit line BL1, the variable resistance layer VR), the SOT layer HM, and the source line SL1, and thus, data may be read according to a resistance level of the variable resistance layer VR. The read operation may include detecting a resistance of the variable resistance layer VR (e.g., the MTJ structure MTJ) by supplying current in the direction from the bit line BL1 toward the source line SL1.

In addition, in some example embodiments the read operation may include detecting a resistance of the variable resistance layer VR (e.g., the MTJ structure MTJ) by supplying current in the direction from the source line SL1 toward the bit line BL1 in a direction opposite to the current flow direction stated in FIG. 4.

Figure 5A:
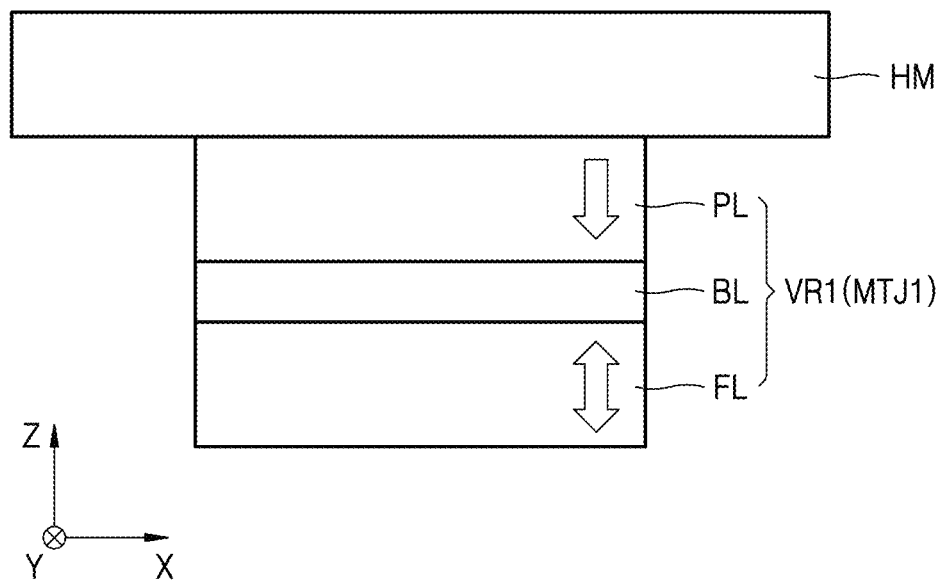
FIGS. 5A and 5B are cross-sectional views of a spin-orbit torque (SOT) layer and a variable resistance layer of the variable resistance memory device of FIGS. 1 and 2.
Figure 5B:
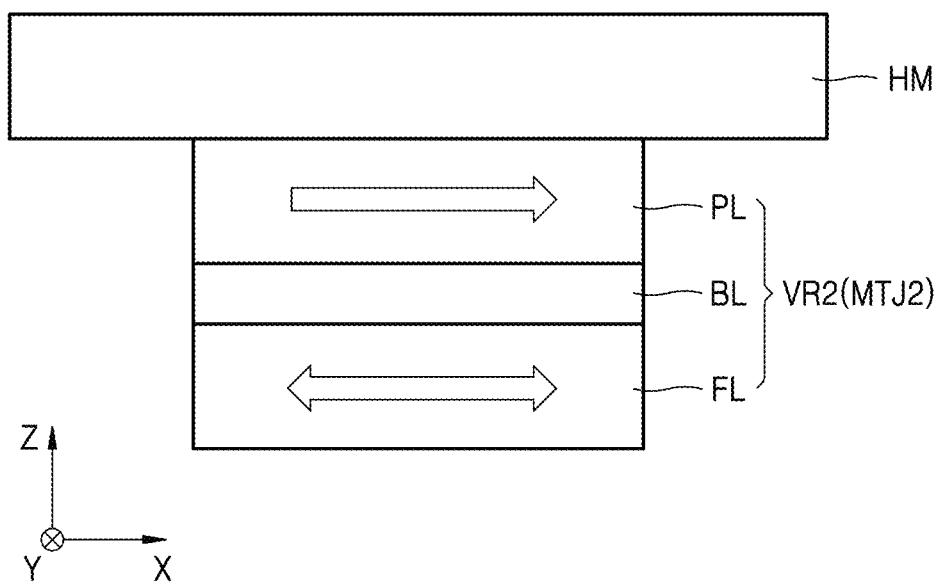

FIGS. 5A and 5B are cross-sectional views of an SOT layer and a variable resistance layer of the variable resistance memory device of FIGS. 1 and 2.

As shown in FIGS. 5A and 5B, the variable resistance memory device (refer to 100 in FIG. 1) may include an SOT layer HM and variable resistance layers VR1 and VR2. Each of the variable resistance layers VR1 and VR2 may correspond to the variable resistance layer VR of FIGS. 1 and 2. The SOT layer HM may include a hard metal layer. In some embodiments, the SOT layer HM may include at least one of a tungsten (W) layer, a cobalt (Co) layer, a tantalum (Ta) layer, and/or a platinum (Pt) layer.

The variable resistance layers VR1 and VR2 may include at least one of the MTJ structures MTJ1 and/or MTJ2, each of which includes a free layer FL, a pinned layer PL, and a barrier layer BL between the free layer FL and the pinned layer PL. The free layer FL may have a variable magnetization direction depending on the conditions. The pinned layer PL may have a fixed magnetization direction.

A magnetization direction of the free layer FL of FIG. 5A may be oriented in a direction perpendicular to a surface of a film forming the free layer FL. A magnetization direction of the pinned layer PL of FIG. 5A may be oriented in a direction perpendicular to a surface of a film forming the pinned layer PL.

A magnetization direction of the free layer FL of FIG. 5B may be oriented in a lateral direction with respect to a surface of a film forming the free layer FL. A magnetization direction of the pinned layer PL of FIG. 5B may be oriented in a lateral direction with respect to a surface of a film forming the pinned layer PL.

When the magnetization direction of the free layer FL is parallel to the magnetization direction of the pinned layer PL, the variable resistance layers VR1 and VR2 may have a low resistance value and store data "0." For example, when the magnetization direction of the free layer FL and the magnetization direction of the pinned layer PL are in the same state (e.g., parallel), the variable resistance layers VR1 and VR2 may have the low resistance value and store data "0."

When the magnetization direction of the free layer FL is anti-parallel to the magnetization direction of the pinned layer PL, the variable resistance layer VR1(VR) may have a high resistance value and store data "1." For example, when the magnetization direction of the free layer FL and the magnetization direction of the pinned layer PL are in different states (e.g., anti-parallel to each other), the variable resistance layer VR1(VR) may have the high resistance value and store data "1."

The MTJ structure MTJ1 of FIG. 5A may include a perpendicular MTJ (PMTJ). When current is supplied to the SOT layer HM in a lateral direction (e.g., the X direction), the PMTJ may indicate that the magnetization directions of the free layer FL and the pinned layer PL are oriented in a direction perpendicular to a current direction (e.g., the X direction).

The MTJ structure MTJ2 of FIG. 5B may include an in-plane MTJ (IMTJ). When current is supplied to the SOT layer HM in the lateral direction (e.g., the X direction), the IMTJ may indicate that the magnetization directions of the free layer FL and the pinned layer PL are oriented parallel to the current direction (e.g., the X direction). In the variable resistance layer VR2, the magnetization directions of the free layer FL and the pinned layer PL may be parallel to each other.

The variable resistance layers VR1 and VR2 may include the MTJ structures MTJ1 and MTJ2. The variable resistance layers VR1 and VR2 may be SOT-type MTJ structures MTJ1 and MTJ2. The SOT-type the MTJ structures MTJ1 and MTJ2 may be based on a spin hall effect.

The spin hall effect may be a phenomenon where spins are separated and accumulated in different directions on a surface when current is supplied to a metal (and/or SOT layer) having strong spin-orbit coupling. The accumulated spins may transmit a torque to an upper magnetic layer (e.g., the free layer FL) and change a magnetization direction of the upper magnetic layer. A variable resistance memory device using an SOT-type variable resistance may separate paths of current for reading and writing data.

Figure 6A:
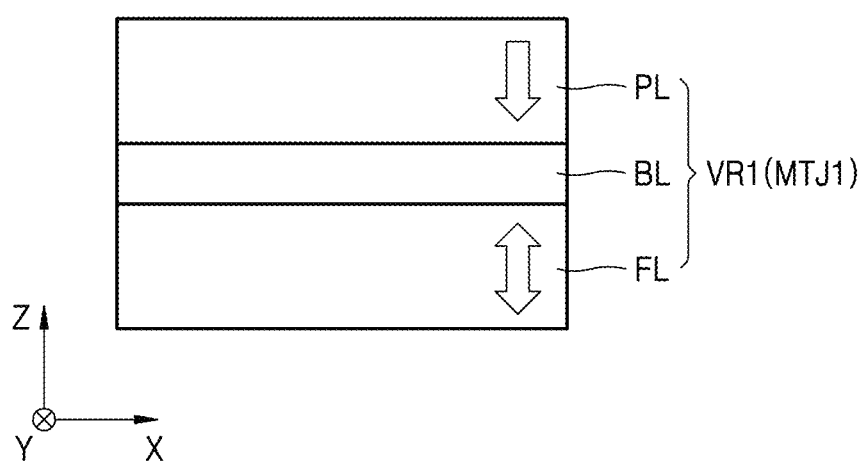
FIGS. 6A to 6C are cross-sectional views of a variable resistance layer of the variable resistance memory device of FIGS. 1 and 2, according to some embodiments.
Figure 6B:
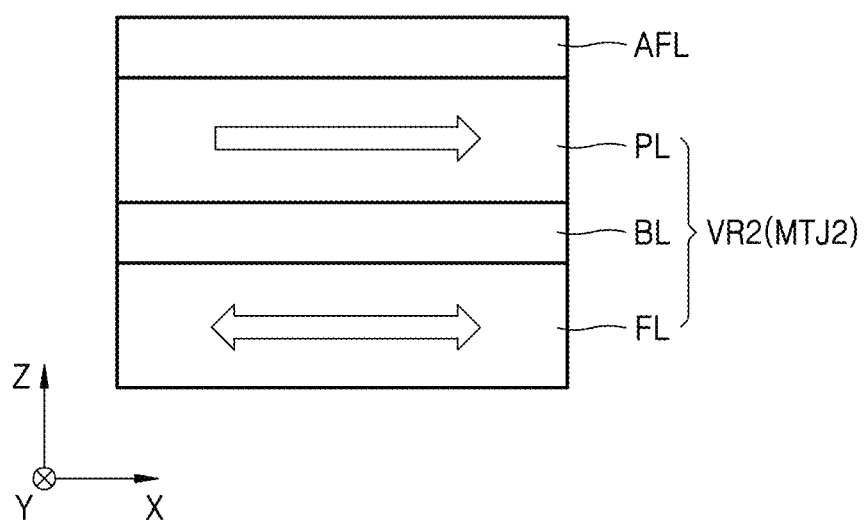
Figure 6C:
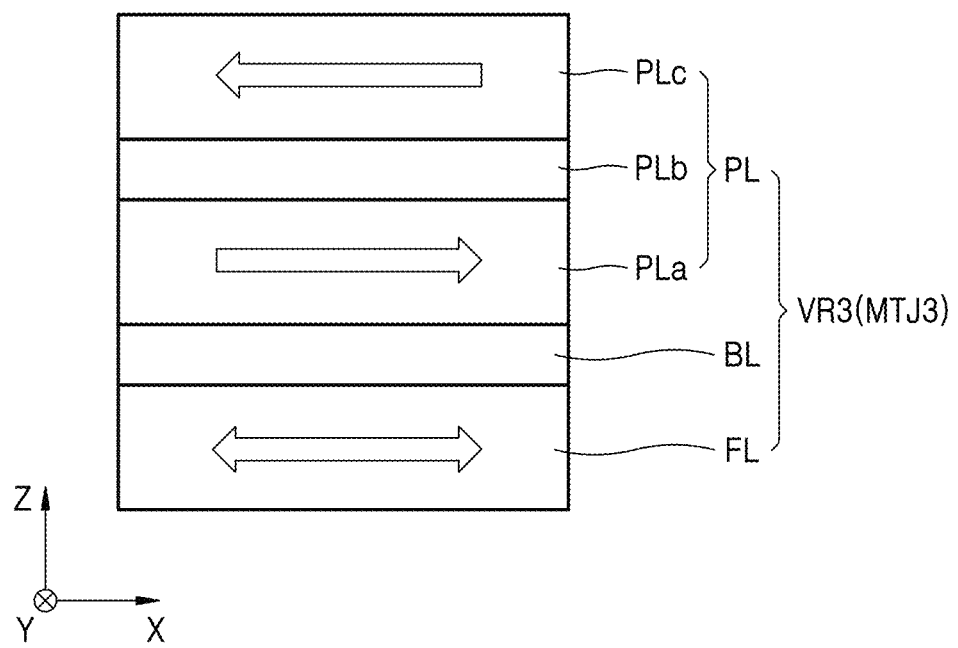

FIGS. 6A to 6C are cross-sectional views of a variable resistance layer of the variable resistance memory device of FIGS. 1 and 2, according to some example embodiments.

Referring to FIG. 6A, a variable resistance layer VR1 having a vertical magnetization direction may be an MTJ structure MTJ1 including a free layer FL, a barrier layer BL, and a pinned layer PL. To implement the variable resistance layer VR1 having the vertical magnetization direction, the free layer FL and the pinned layer PL may include a material having high magnetic anisotropy energy. The material having the high magnetic anisotropy energy may include a multilayered thin film including, for example, an amorphous rare-earth element alloy, (e.g., (Co/Pt)n, and/or (Fe/Pt)n).

In some embodiments, the free layer FL may include a ferromagnetic material (e.g., an alloy including at least one of cobalt (Co), iron (Fe), and/or nickel (Ni)) having a magnetic moment of which a magnetization direction is freely changed irrespective of a direction perpendicular to a plane of a layer, and further include another element, such as boron (B), chromium (Cr), platinum (Pt), and/or palladium (Pd). Although the free layer FL may include a different material from the pinned layer PL, the free layer FL may also include the same material as the pinned layer PL.

In some embodiments, the free layer FL may include an ordered alloy and include at least one of iron (Fe), cobalt (Co), nickel (Ni), palladium (Pa), and/or platinum (Pt).

The free layer FL may include, for example, at least one of a Fe—Pt alloy, a Fe—Pd alloy, a Co—Pd alloy, a Co—Pt alloy, a Fe—Ni—Pt alloy, a Co—Fe—Pt alloy, and/or a Co—Ni—Pt alloy. For example, stoichiometric expressions of the alloys in some example embodiments may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, and/or $Co_{30}Ni_{20}Pt_{50}$.

To increase a tunnel magnetoresistance ratio (TMR) of the variable resistance layer VR1, the barrier layer BL may be between the free layer FL and the pinned layer PL. In some embodiments, the barrier layer BL may have a thickness of about 8 Å to about 15 Å.

The barrier layer BL may have a thickness less than a spin diffusion distance. The barrier layer BL may include a non-magnetic material. For example, the barrier layer BL may include at least one selected from magnesium (Mg), titanium (Ti), aluminum (Al), magnesium-zinc (MgZn), an oxide of magnesium-zinc (MgB), nitrides of titanium (Ti), and vanadium (V), and/or the like.

In some embodiments, the ferromagnetic material forming the pinned layer PL may include at least one of Co, Fe, and Ni and further include another element, such as B, Cr, Pt, and Pd. In some embodiments, although the pinned layer PL is illustrated as a single layer, the pinned layer PL is not limited thereto and may have a multilayered structure.

In some embodiments, the pinned layer PL may have a multilayered structure in which a first layer including at least one of Co and a Co alloy and a second layer including at least one of Pt, Ni, and Pd are alternately stacked, a FePt layer and/or a CoPt layer having an L10 structure, and/or an alloy layer of a rare-earth element and a transition metal.

Here, the rare-earth element may be, for example, at least one of terbium (Tb) and/or gadolinium (Gd), and the transition metal may be at least one of Ni, Fe, and/or Co. Alloys of various combinations of the rare-earth element and the transition metal may be used. Among the alloys, for example, cobalt iron boron (CoFeB) and/or cobalt iron (CoFe) may be used as materials for the pinned layer PL.

The pinned layer PL may include an ordered alloy and include at least one of iron (Fe), cobalt (Co), nickel (Ni), palladium (Pa), and/or platinum (Pt). For example, the pinned layer PL may include at least one of a Fe—Pt alloy, a Fe—Pd alloy, a Co—Pd alloy, a Co—Pt alloy, a Fe—Ni—Pt alloy, a Co—Fe—Pt alloy, and/or a Co—Ni—Pt alloy. For example, stoichiometric expressions of the alloys in some example embodiments may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, and/or $Co_{30}Ni_{20}Pt_{50}$.

In some embodiments, the free layer FL, the barrier layer BL, and the pinned layer FL may have the same crystal structure. For example, each of the free layer FL, the barrier layer BL, and the pinned layer FL may have a body-centered cubic (BCC) crystal structure.

Referring to FIG. 6B, a variable resistance layer VR2 having a lateral magnetization direction may be the MTJ structure MTJ2 including the free layer FL, the barrier layer BL, and the pinned layer PL. The variable resistance layer VR2 may include an anti-ferromagnetic layer (AFL).

The free layer FL may include a material having a variable magnetization direction. The free layer FL may include a ferromagnetic material including at least one of cobalt (Co), iron (Fe), and/or nickel (Ni). For example, the free layer FL may include at least one selected from iron boron (FeB), iron (Fe), cobalt (Co), nickel (Ni), gadolinium (Gd), dysprosium (Dy), cobalt iron (CoFe), nickel iron (NiFe), manganese arsenide (MnAs), manganese bismuth (MnBi), manganese antimonide (MnSb), $CrO_2$, $MnOFe_2O_3$, $FeOFe_2O_3$, $NiOFe_2O_3$, $CuOFe_2O_3$, $MgOFe_2O_3$, europium oxide (EuO), and/or yttrium ferrite ($Y_3Fe_5O_{12}$).

The barrier layer BL may include a non-magnetic material. The barrier layer has been described above, and thus, a repeat of the description thereof is omitted here. The pinned layer PL may have a fixed magnetization direction due to an AFL. In addition, the pinned layer PL may include a ferromagnetic material. For example, the pinned layer PL may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$.

The anti-ferromagnetic layer AFL may include an anti-ferromagnetic material. For example, the anti-ferromagnetic layer AFL may include at least one selected from PtMn, IrMn, MnO, MnS, MnTe, $MnF_2$, $FeCl_2$, FeO, $CoCl_2$, CoO, $NiCl_2$, NiO, and/or Cr.

Referring to FIG. 6C, a variable resistance layer VR3 may be an MTJ structure MTJ3 including the free layer FL, the barrier layer BL, and the pinned layer PL. The pinned layer PL of the variable resistance layer VR3 may include synthetic anti-ferromagnetic (SAF). The pinned layer PL may include a first ferromagnetic layer PLa, a coupling layer PLb, and a second ferromagnetic layer PLc.

Each of the first and second ferromagnetic layers PLa and PLc may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$. A magnetization direction of the first ferromagnetic layer PLa and a magnetization direction of the second ferromagnetic layer PLc may be different from each other and be each a fixed magnetization direction. The coupling layer PLb may include ruthenium (Ru).

Figure 7:
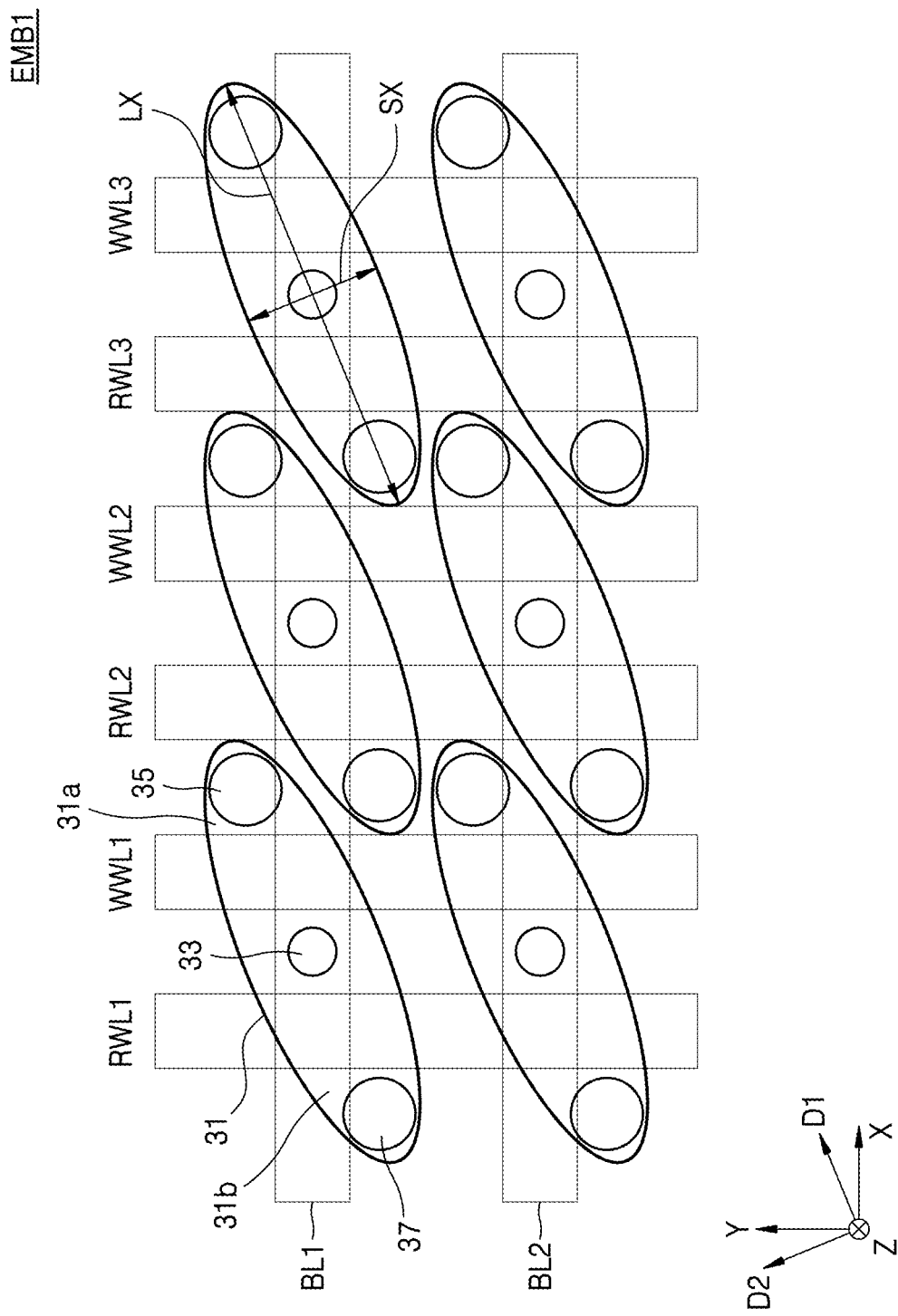
FIGS. 7 to 9 are layout diagrams of a variable resistance memory device according to some embodiments.
Figure 8:
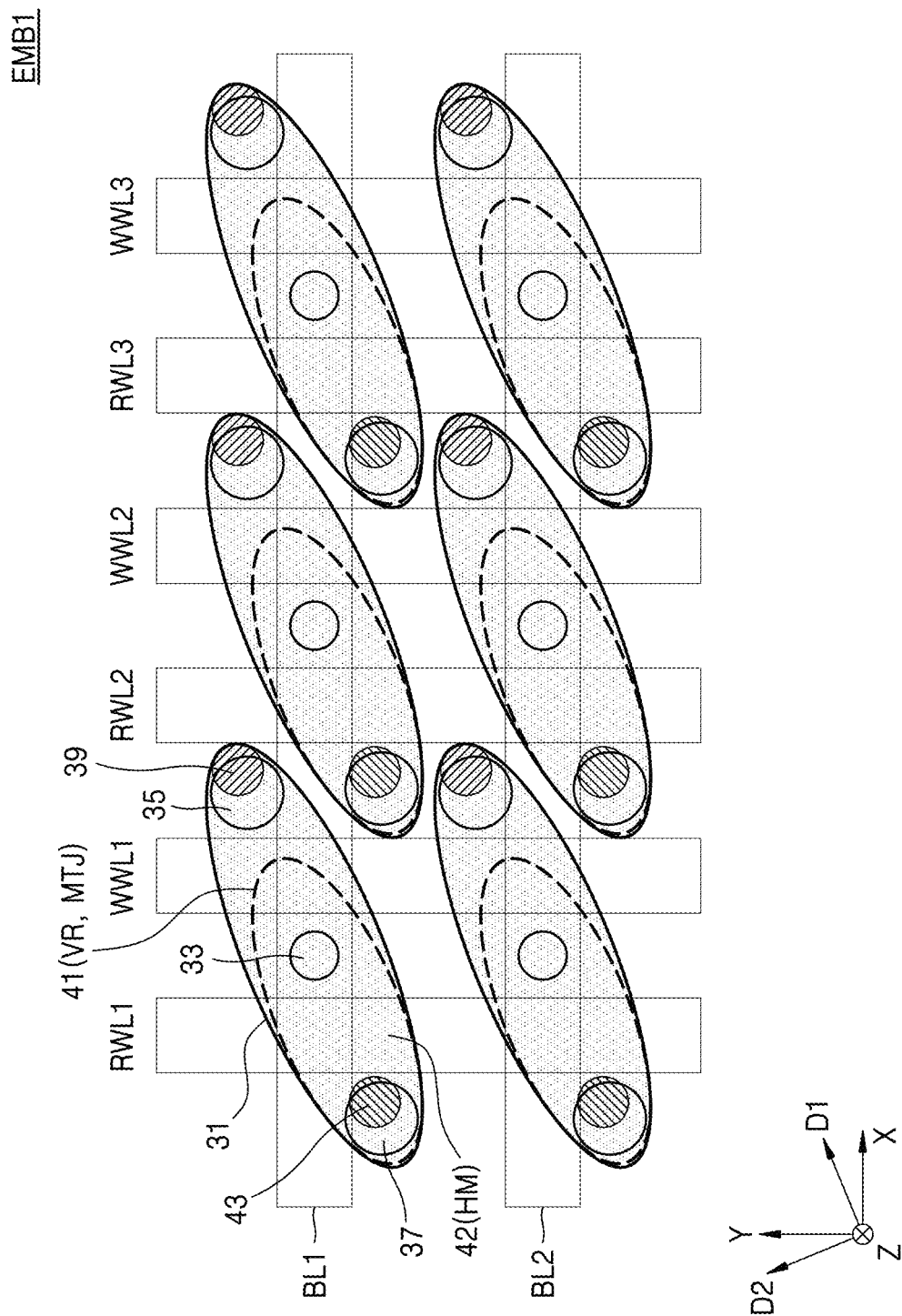
Figure 9:
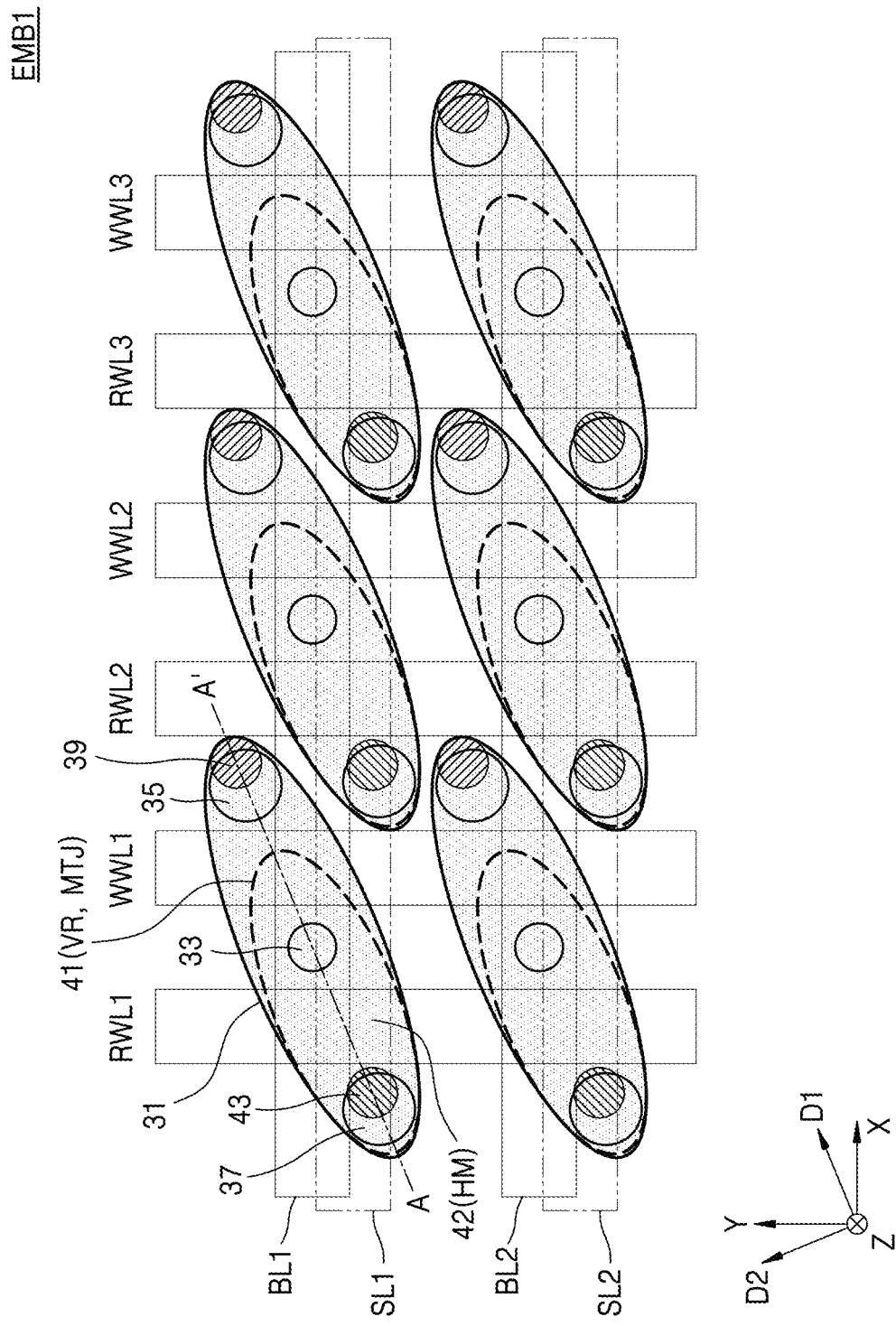

FIGS. 7 to 9 are layouts of a variable resistance memory device according to some embodiments.

FIGS. 7 to 9 illustrate a first embodiment EMB1, which implements the variable resistance memory device 100 of FIGS. 1 to 4. The description of components of FIGS. 7 to 9 that are the same as those of FIGS. 1 to 4 will be omitted or briefly presented.

FIG. 7 illustrates the arrangement of active regions 31, common bit line contacts 33, first active source contacts 35, and second active source contacts 37. As shown in FIG. 7, a plurality of active regions 31 may be on a semiconductor substrate (not shown) and apart from each other in a first direction (e.g., Y direction) and a second direction (e.g., X direction) that is perpendicular to the first direction (e.g., Y direction). The active regions 31 may be separated from each other in the first direction and the second direction and arranged in a matrix form.

The active regions 31 may have an elliptical shape. The active regions 31 may be inclined in a first diagonal direction (e.g., the D1 direction) between the first direction (e.g., the Y direction) and the second direction (e.g., the X direction). When the active regions 31 is arranged in an elliptical shape in the first diagonal direction (e.g., the D1 direction), the integration density of a variable resistance memory device may be increased by optimizing the arrangement of memory cells. The active region 31 may have a major-axis direction LX and a minor-axis direction SX. The major-axis direction LX may correspond to the first diagonal direction D1.

A second diagonal direction (e.g., the D2 direction) may be between the first direction (e.g., Y direction) and an anti-parallel second direction (e.g., the –X direction). The minor-axis direction SX may correspond to the second diagonal direction. Although the active regions 31 are illustrated as being inclined in the first diagonal direction D1, in some example embodiments the active regions 31 may be inclined in the second diagonal direction D2.

A plurality of common bit line contacts 33 may be in central portions of the active regions 31. A plurality of first active source contacts 35 may be on first active regions 31a near one edge of each of the common bit line contacts 33, from among the active regions 31. A plurality of second active source contacts 37 may be on second active regions 31b near another edge of each of the common bit line contacts 33, from among the active regions 31.

A plurality of word lines WWL1 to WWL3 and RWL1 to RWL3 may extend in the first direction (e.g., the Y direction) to be apart from each other in the second direction (e.g., the X direction) between the first active source contacts 35 and the common bit line contacts 33 and between the common bit line contacts 33 and the second active source contacts 37.

The plurality of word lines WWL1 to WWL3 and RWL1 to RWL3 may include write word lines WWL1 to WWL3 and read word lines RWL1 to RWL3. Unlike as shown in FIG. 1, in FIG. 7, the read word line RWL1, the write word line WWL1, the read word line RWL2, the write word line WWL2, the read word line RWL3, and the write word line WWL3 may be sequentially arranged in the second direction (e.g., the X direction).

On the common bit line contacts 33, a plurality of bit lines BL1 and BL2 may extend in the second direction (e.g., the X direction) and be apart from each other in the first direction (e.g., Y direction). The first active source contacts 35 and the second active source contacts 37 may be sequentially arranged apart from each other in the first direction (e.g., the Y direction) between the read word lines RWL1 to RWL3 and the write word lines WWL1 to WWL3. The first active source contacts 35 may be read contacts. The second active source contacts 37 may be wire contacts.

FIG. 8 illustrates the arrangement of a plurality of first middle connection contacts 39, a plurality of variable resistance layers 41(VR), a plurality of SOT layers 42(HM), and a plurality of source line contacts 43. The variable resistance layers 41(VR) may include an MTJ structure MTJ of an SOT type.

A plurality of variable resistance layers 41(VR) may be on the active regions 31, the word lines WWL1 to WWL3 and RWL1 to RWL3, and the bit lines BL1 and BL2 and electrically connected to the second active source contacts 37. In a top view (e.g., a plan or top view), the variable resistance layers 41(VR) may have a smaller area than an area of the active regions 31 and overlap the active regions 31. A vertical connection relationship between the second active source contacts 37 and the variable resistance layers 41(VR) will be described in detail below.

The plurality of SOT layers 42(HM) may be on the variable resistance layer 41(VR) over the active regions 31, the word lines WWL1 to WWL3 and RWL1 to RWL3, and the bit lines BL1 and BL2 and electrically connected to the first active source contacts 35 through the first middle connection contacts 39. In a top view (e.g., the plan or top view), the SOT layers 42(HM) may have the same area as an area of the active regions 31 and overlap the active regions 31.

In some embodiments, the first active source contacts 35 may be directly and electrically connected to the SOT layers 42(HM) without using a first middle connection contact 39. A vertical electrical connection relationship between the first active source contacts 35 and the SOT layers 42(HM) will be described in detail below. The source line contacts 43 may be on the SOT layer 42(HM) that is on the second active source contacts 37.

The first middle connection contacts 39 and the source line contacts 43 may be sequentially in the first direction (e.g., the Y direction) between the read word lines RWL1 to RWL3 and the write word lines WWL1 to WWL3. The first middle connection contacts 39 may be between the source line contacts 43 in the first direction (e.g., the Y direction) and between the read word lines RWL1 to RWL3 and the write word lines WWL1 to WWL3. The source line contacts 43 may be between the read word lines RWL1 to RWL3 and the write word lines WWL1 to WWL3 and be between the first middle connection contacts 39 in the first direction (Y direction).

FIG. 9 illustrates the arrangement of the source lines SL1 and SL2. On the source line contacts 43, a plurality of source lines SL1 and SL2 may extend in a second direction (e.g., X direction) and be apart from each other in the first direction (e.g., Y direction). The source lines SL1 and SL2 may be electrically connected to the source line contacts 43. A vertical connection relationship between the source lines SL1 and SL2 and the source line contacts 43 will be described in detail below.

Figure 10:
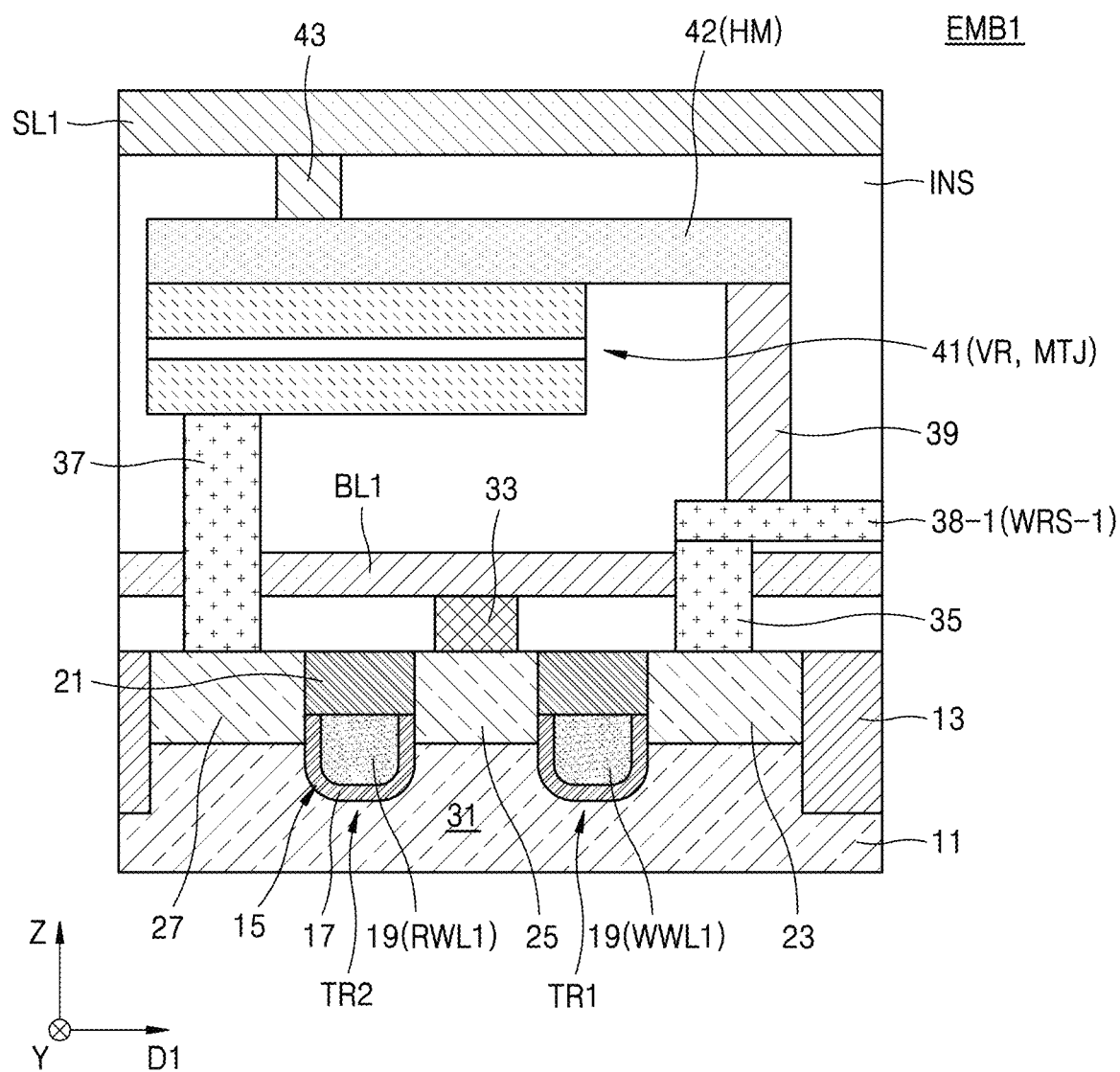
FIG. 10 is a cross-sectional view the variable resistance memory device taken along line A-A' of FIG. 9.

FIG. 10 is a cross-sectional view of the variable resistance memory device 100, which is taken along line A-A' of FIG. 9.

Although FIG. 10 is the cross-sectional view taken along line A-A' of FIG. 9, FIG. 10 may further include some components, which are not taken along line A-A' of FIG. 9, for brevity. The description of components of FIG. 10 that are the same as those of FIGS. 7 to 9 will be omitted or briefly presented.

The first embodiment EMB1 of FIG. 10 may be an example of implementing a stereoscopic view of the variable resistance memory device (refer to 100 in FIG. 1) shown in FIG. 4. The first embodiment EMB1 of FIG. 10 may be substantially the same as that of FIG. 4 except that a second transistor TR2 is on a left side and a first transistor TR1 is on a right side in a first diagonal direction (D1 direction).

In the variable resistance memory device (refer to 100 in FIG. 1 according to the first embodiment EMB1, an active region 31 may be formed in a semiconductor substrate 11. The semiconductor substrate 11 may include a silicon substrate, for example, a P-type silicon substrate. The active region 31 may be defined by the non-active region 13 formed in the semiconductor substrate 11. A first source/drain region 23, a second source/drain region 25, and a third source/drain region 27 may be formed in the active region 31.

The first source/drain region 23, the second source/drain region 25, and the third source/drain region 27 may extend in the first direction (e.g., the Y direction) and be apart from each other in the first diagonal direction (e.g., the D1 direction). A write word line WWL1 may be formed inside a trench 15 between the first source/drain region 23 and the second source/drain region 25 in the semiconductor substrate 11 and extend in a first direction (Y direction).

The first source/drain region 23 may correspond to the first source SR1 of the variable resistance memory device 100, which has been described above. The second source/drain region 25 may correspond to the first drain DR1 of the variable resistance memory device 100, which has been described above. The write word line WWL1 may be the first gate GE1. The write word line WWL1 serving as the first gate GE1, the first source/drain region 23, and the second source/drain region 25 may constitute the first transistor TR1 of the variable resistance memory device 100, which has been described above.

A read word line RWL1 may be formed inside each of the trenches 15 between the second source/drain region 25 and the third source/drain region 27 and extend in the first direction (e.g., the Y direction). A gate insulating layer 17 may be between the read word line RWL1 and each of the trenches 15. A capping insulating layer 21 may be on the write word line WWL1 and the read word line RWL1.

The second source/drain region 25 may correspond to the second drain DR2 of the variable resistance memory device 100, which has been described above. The second source/drain region 25 may be a common drain including the first drain DR1 and the second drain DR2.

The third source/drain region 27 may correspond to the second source SR2 of the variable resistance memory device 100, which has been described above. The read word line RWL1 may be the second gate GE2. The read word line RWL1 serving as the second gate GE2, the second source/drain region 25, and the third source/drain region 27 may constitute the second transistor TR2 of the variable resistance memory device 100, which has been described above.

A first active source contact 35 and a second active source contact 37 may be respectively formed on the first source/drain region 23 and the third source/drain region 27. A common bit line contact 33 may be formed on the second source/drain region 25. The common bit line contact 33, the first active source contact 35, and the second active source contact 37 may constitute a via layer extending in a third direction (e.g., a Z direction). The third direction (e.g., the Z direction) may be a direction perpendicular to a surface of the semiconductor substrate 11.

The first active source contact 35 may be connected to a lower portion of the SOT layer 42(HM) through a first middle wiring layer 38-1 and a first middle connection contact 39. The first active source contact 35 may be connected to the first middle connection contact 39 through a first wiring structure WRS1-1 including the first middle wiring layer 38-1, and the first middle connection contact 39 may be connected to the lower portion of the SOT layer 42(HM). The second active source contact 37 may be directly connected to a variable resistance layer 41(VR) (e.g., the MTJ structure MTJ).

The SOT layer 42(HM) may be formed on the variable resistance layer 41(VR). The SOT layer 42(HM) may extend in the first diagonal direction (D1 direction) further than one edge of the variable resistance layer 41(VR). Accordingly, as described above, the lower portion of the SOT layer 42 may be connected to the first middle connection contact 39.

The source line contact 43 may be formed on the SOT layer 42(HM). The source line contact 43 may include a via layer. The source line contact 43 may be above the second active source contact 37. The source line SL1 may be on the source line contact 43. Components on the semiconductor substrate 11 may be insulated from each other by an insulating layer INS.

Figure 11:
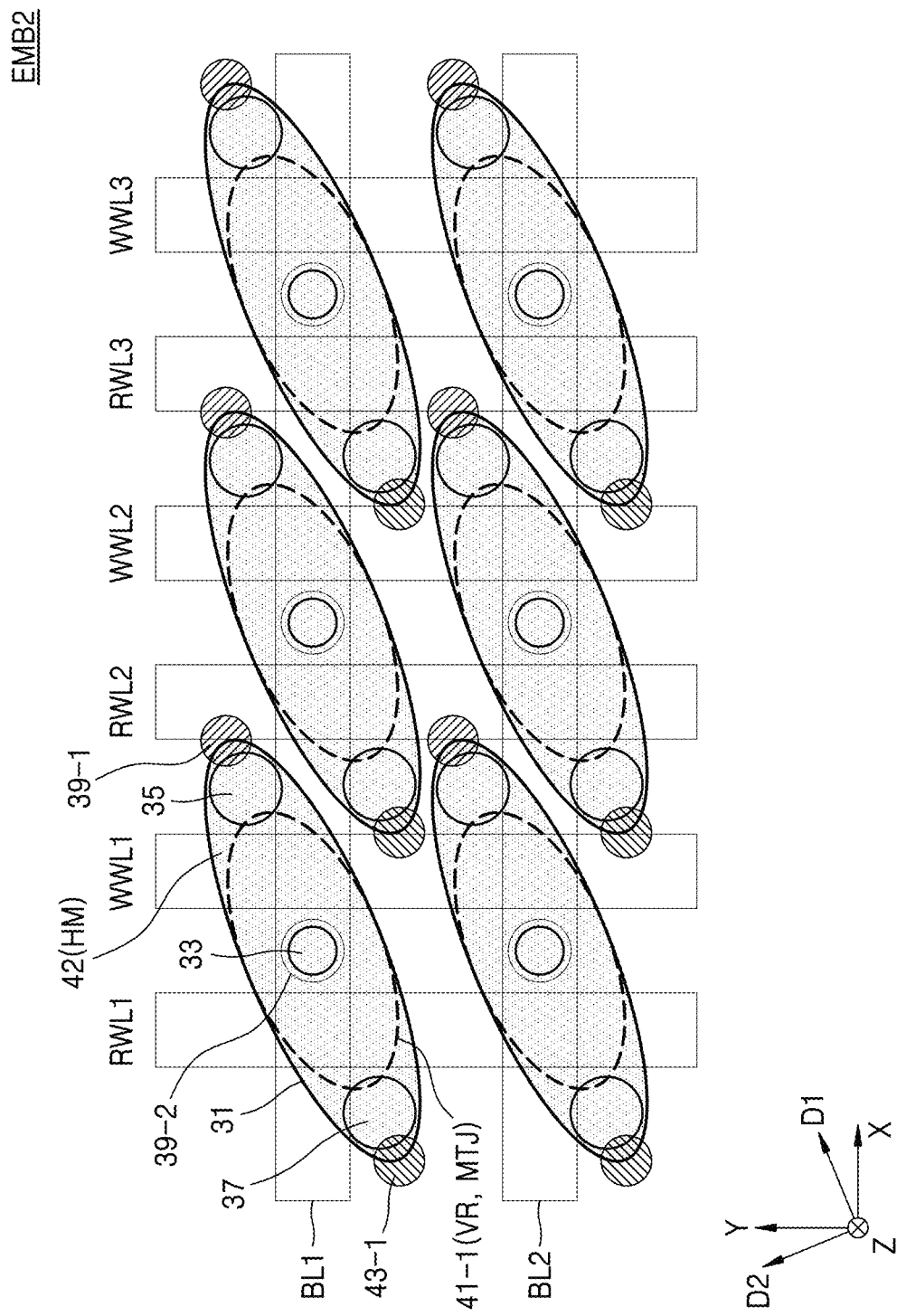
FIGS. 11 and 12 are layout diagrams of a variable resistance memory device according to some embodiments.
Figure 12:
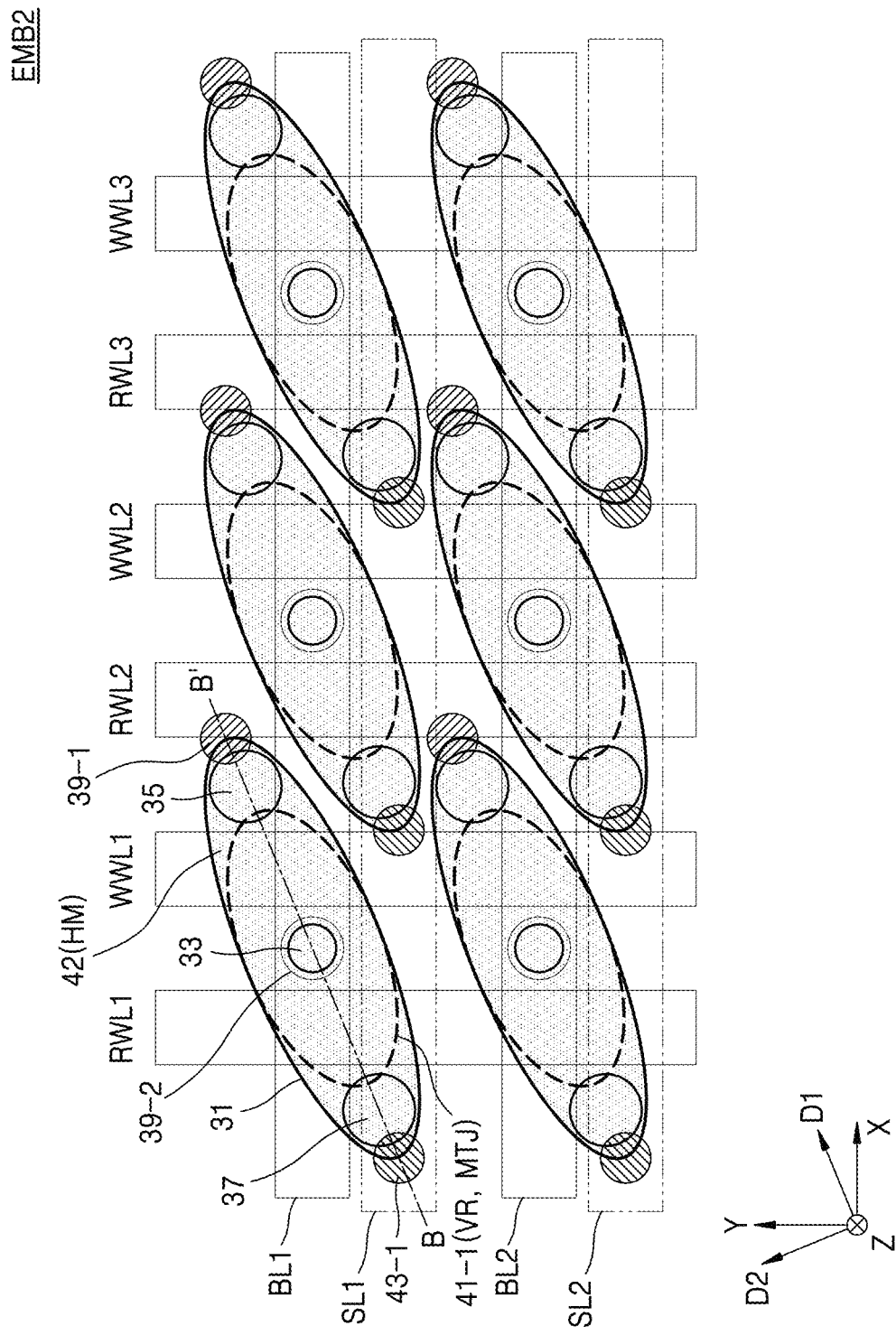
Figure 13:
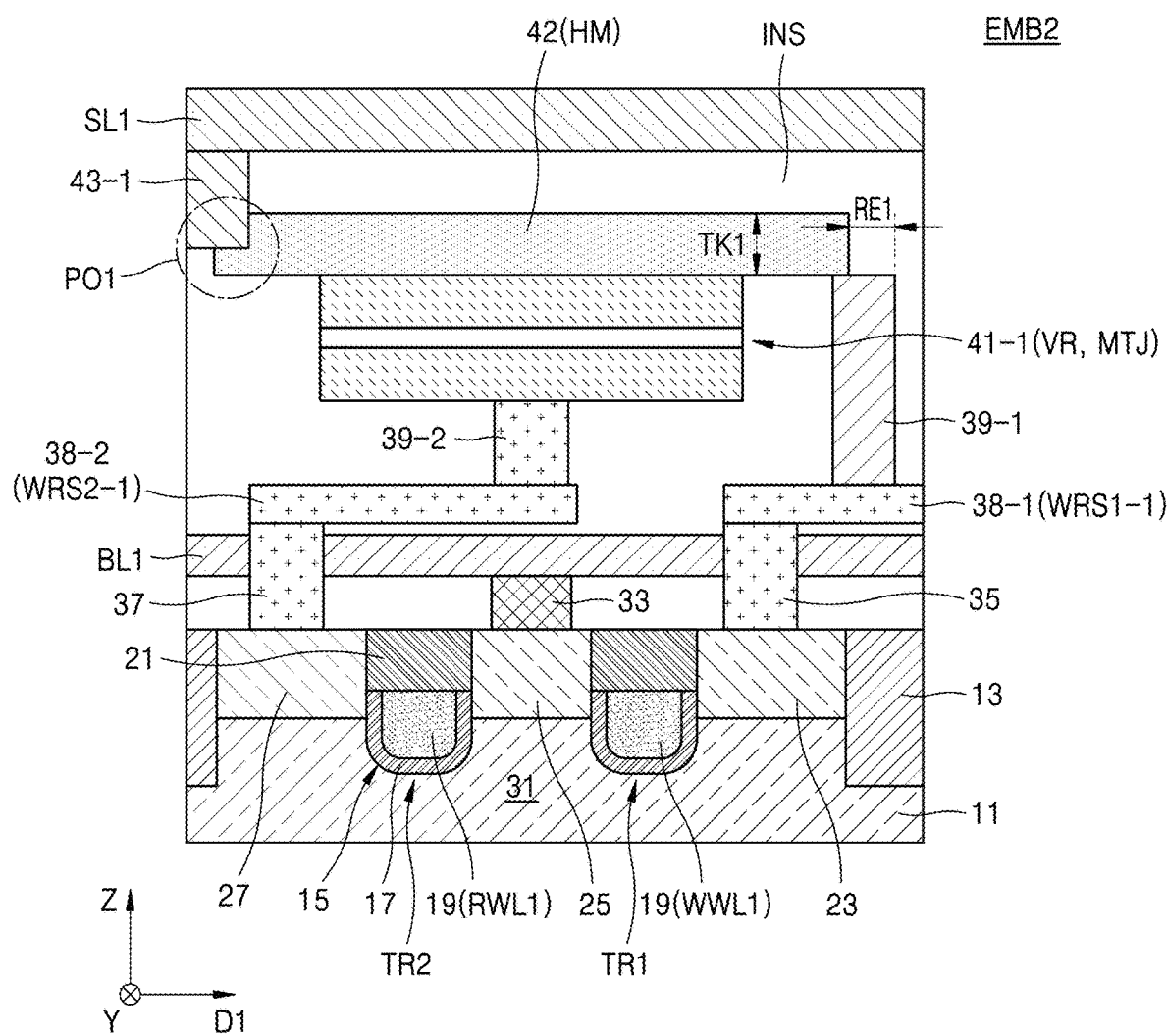
FIG. 13 is a cross-sectional view of the variable resistance memory device taken along line B-B' of FIG. 12.

FIGS. 11 and 12 are layout diagrams of a variable resistance memory device according to some embodiments. FIG. 13 is a cross-sectional view of the variable resistance memory device 100, which is taken along line B-B' of FIG. 12.

Specifically, FIGS. 11 and 12 illustrate a second embodiment EMB2, which implements the variable resistance memory device 100 of FIGS. 1 to 4. The second embodiment EMB2 of FIGS. 11 and 12 may be substantially the same as the first embodiment EMB1 of FIGS. 7 to 9 except that positions of a variable resistance layers 41-1(VR), a first middle connection contacts 39-1, a second middle connection contacts 39-2, and a source line contacts 43-1 are shifted. The description of components of FIGS. 11 and 12 that are the same as those of FIGS. 1 to 4 and 7 to 9 will be omitted or briefly presented.

The active regions 31, the common bit line contacts 33, the first active source contacts 35, and the second active source contacts 37 may be arranged as shown in FIG. 7 above. The arrangement of the active regions 31, the common bit line contacts 33, the first active source contacts 35, and the second active source contacts 37 has been described above, and descriptions thereof are omitted here.

FIG. 11 illustrates the arrangement of a plurality of first middle connection contacts 39-1, a plurality of second middle connection contacts 39-2, a plurality of variable resistance layers 41-1(VR), a plurality of SOT layers 42(HM), and a plurality of source line contacts 43-1. Each of the variable resistance layers 41-1(VR) may include an MTJ structure MTJ of an SOT type. A plurality of variable resistance layers 41-1(VR) may be on the active regions 31, the word lines WWL1 to WWL3 and RWL1 to RWL3, and the bit lines BL1 and BL2 and electrically connected to the second active source contacts 37. A vertical connection relationship between the second active source contacts 37 and the variable resistance layers 41-1(VR) will be described in detail below.

The plurality of SOT layers 42(HM) may be on the variable resistance layer 41-1(VR) over the active regions 31, the word lines WWL1 to WWL3 and RWL1 to RWL3, and the bit lines BL1 and BL2 and electrically connected to the first active source contacts 35 through the first middle connection contacts 39-1. The first middle connection contacts 39-1 may be at an outer side of edges of the active regions 31.

The first middle connection contacts 39-1 may be at an outer side of edges of the first active source contacts 35. A vertical connection relationship between the first active source contacts 35 and the SOT layers 42(HM) by using the first middle connection contacts 39-1 will be described in detail below. The second middle connection contacts 39-2 may be in a central portion of a variable resistance layer 41-1(VR).

The second middle connection contacts 39-2 may be electrically connected to the second active source contacts 37. A vertical connection relationship between the second active source contacts 37 and the variable resistance layer 41-1(VR) by using the second middle connection contacts 39-2 will be described in detail below.

The source line contacts 43-1 may be on the SOT layers 42(HM), which are on the second active source contacts 37. The first middle connection contacts 39-1 and the source line contacts 43-1 may be arranged to be zigzag in the first direction (Y direction) in edge portions of read word lines RWL1 to RWL3 and write word lines WWL1 to WWL3.

The first middle connection contacts 39-1 may be between the source line contacts 43-1 in the first direction (e.g., the Y direction) in the edge portions of the read word lines RWL1 to RWL3 and the write word lines WWL1 to WWL3. The source line contacts 43-1 may be between the first middle connection contacts 39-1 in the first direction (e.g., the Y direction) in the edge portions of the read word lines RWL1 to RWL3 and the write word lines WWL1 to WWL3.

FIG. 12 illustrates the arrangement of the source lines SL1 and SL2. A plurality of source lines SL1 and SL2 may extend in a second direction (e.g., the X direction) on the source line contacts 43-1 and be apart from each other in the first direction (e.g., the Y direction). The source lines SL1 and SL2 may be electrically connected to the source line contacts 43. A vertical connection relationship between the source lines SL1 and SL2 and the source line contacts 43-1 will be described in detail below.

Referring to FIG. 13, the second embodiment EMB2 may be substantially the same as the first embodiment EMB1 of FIG. 10 except that a first middle connection contact 39-1 does not vertically entirely overlap the SOT layer 42(HM) and the second middle connection contact 39-2 is connected to a central portion of the variable resistance layer 41-1(VR).

Although FIG. 13 is the cross-sectional view taken along line B-B' of FIG. 12, FIG. 13 may further include some components, which are not taken along line B-B' of FIG. 12, for brevity. The description of components of FIG. 13 that are the same as those of FIGS. 10, 11, and 12 will be omitted or briefly presented.

The second embodiment EMB2 of FIG. 13 may be an example of implementing a stereoscopic view of the variable resistance memory device (refer to 100 in FIG. 1) shown in FIG. 4. In the second embodiment EMB2, the variable resistance memory device (refer to 100 in FIG. 1) may include an active region 31, a first source/drain region 23, a second source/drain region 25, and a third source/drain region 27.

A first active source contact 35 and a second active source contact 37 may be respectively formed on the first source/drain region 23 and the third source/drain region 27. A common bit line contact 33 may be formed on the second source/drain region 25.

The first active source contact 35 may be electrically connected to a lower portion of the SOT layer 42(HM). The first active source contact 35 may be electrically connected to the lower portion of the SOT layer 42(HM) through the first middle wiring layer 38-1 and the first middle connection contact 39-1. The first active source contact 35 may be shifted by the first middle wiring layer 38-1 (e.g., a first wiring structure WRS1-1) and electrically connected to the SOT layer 42(HM) through the first middle connection contact 39-1.

In addition, in a vertical cross-sectional view, one edge portion of the SOT layer 42(HM) may be recessed by a recess length RE1 from one edge portion of the first middle connection contact 39-1.

The second active source contact 37 may be electrically connected to a central portion of a variable resistance layer 41(VR) (e.g., the MTJ structure MTJ). The second active source contact 37 may be shifted by a second middle wiring layer 38-2 (e.g., the second wiring structure WRS2-1) and electrically connected to the central portion of the variable resistance layer 41(VR) through the second middle connection contact 39-2.

The SOT layer 42(HM) may be formed on the variable resistance layer 41-1(VR). The SOT layer 42(HM) may have a first thickness TK1. The SOT layer 42(HM) may extend in a first diagonal direction (e.g., the D1 direction) further than both edges of the variable resistance layer 41(VR). For example, as described above, the lower portion of the SOT layer 42 may be connected to the first middle connection contact 39-1.

A source line contact 43-1 may be formed on the SOT layer 42(HM). The source line contact 43-1 may include a via layer. In a vertical cross-sectional view, another edge portion of the SOT layer 42(HM) may be recessed from one edge of the source line contacts 43-1. The source line contact 43-1 may not vertically overlap the variable resistance layer 41-1(VR). The source line contact 43-1 may be at an outer side of one edge of the SOT layer 42(HM).

As indicated by PO1, the source line contact 43-1 may vertically extend into and come into contact with the SOT layer 42(HM). The source line contact 43-1 may be over the second active source contact 37. The source line SL1 may be on the source line contact 43. The above-described components on a semiconductor substrate 11 may be insulated from each other and/or supported by an insulating layer INS.

Figure 14:
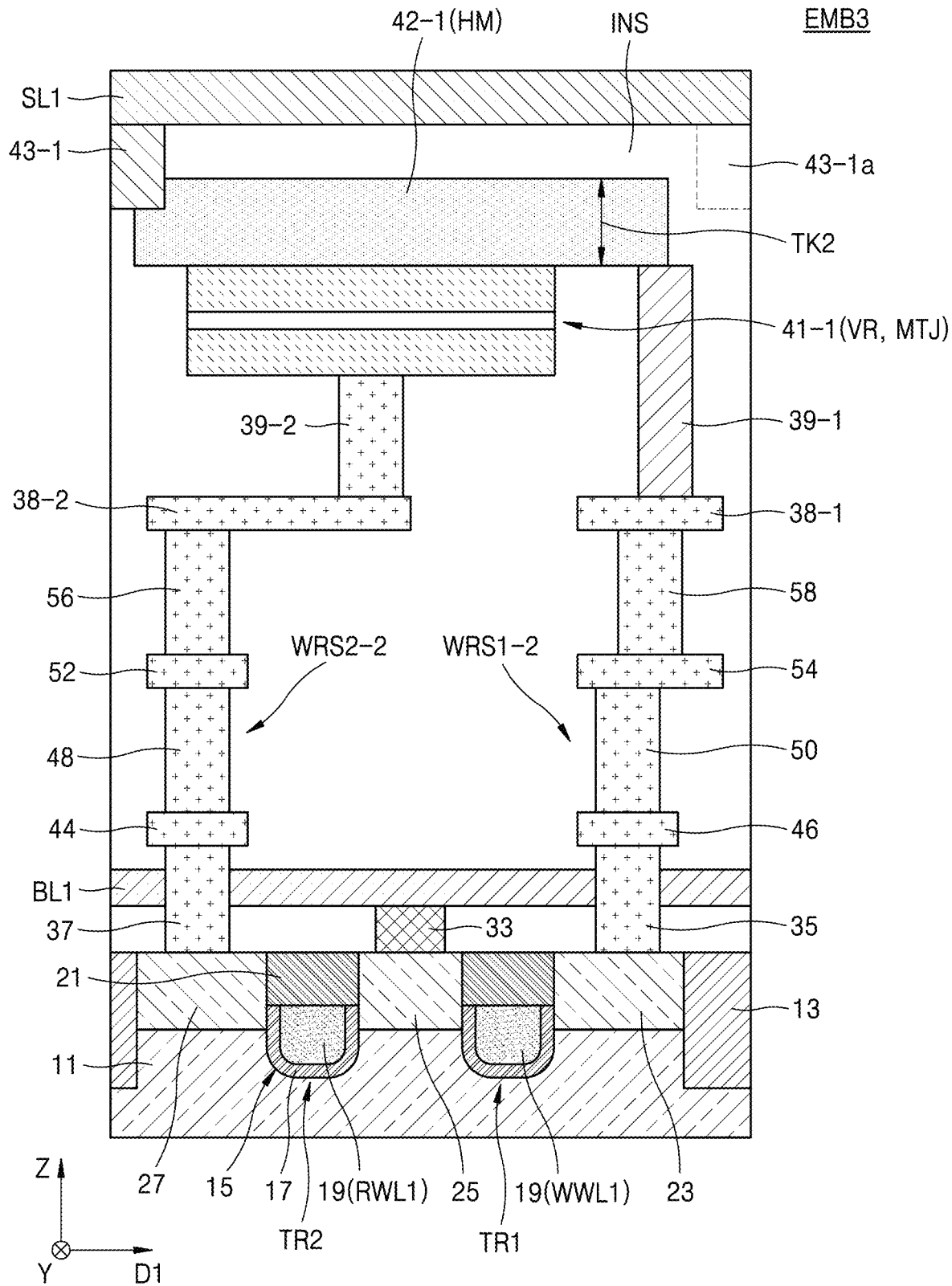
FIG. 14 is a layout diagram of a variable resistance memory device according to some embodiments.

FIG. 14 is a cross-sectional view of a variable resistance memory device according to some embodiments.

FIG. 14 illustrates a third embodiment EMB3, which implements the variable resistance memory device 100 of FIGS. 1 to 4. The third embodiment EMB3 of FIG. 14 may be substantially the same as the second embodiment EMB2 of FIGS. 11 to 13 except that a first active source contact 35 is electrically connected to the first middle connection contact 39-1 by using a first wiring structure, and the second active source contact 37 is electrically connected to the second middle connection contact 39-2 by using a second wiring structure.

The description of components of FIG. 14 that are the same as those of FIGS. 11 to 13 will be omitted or briefly presented. The third embodiment EMB3 of FIG. 14 may be an example of implementing a stereoscopic view of the variable resistance memory device (refer to 100 in FIG. 1) shown in FIG. 4. For example, in the third embodiment EMB3, the variable resistance memory device (refer to 100 in FIG. 1) may include an active region 31, a first source/drain region 23, a second source/drain region 25, and a third source/drain region 27.

A first active source contact 35 and a second active source contact 37 may be respectively formed on the first source/drain region 231 and the third source/drain region 27. A common bit line contact 33 may be formed on the second source/drain region 25.

The first active source contact 35 may be electrically connected to a lower portion of the SOT layer 42-1(HM). The first active source contact 35 may be electrically connected to the lower portion of the SOT layer 42-1(HM) through a first lower via/wiring layer 46, 50, 54, and 58, the first middle wiring layer 38-1, and the first middle connection contact 39-1. The first active source contact 35 may be shifted by a first wiring structure WRS1-2 including the first lower via/wiring layer 46, 50, 54, and 58 and the first middle wiring layer 38-1 and electrically connected to the SOT layer 42-1(HM) through the first middle connection contact 39-1.

In addition, one edge portion of the SOT layer 42-1(HM) may be recessed from one edge portion of the first middle connection contact 39-1 in a vertical cross-sectional view. The SOT layer 42-1(HM) may have a second thickness TK2, which is greater than the first thickness TK1, and may be apart from a source line contact 43-1a adjacent thereto. In some embodiments, for example, a thickness of the SOT layer 42-1(HM) may be freely adjusted.

The second active source contact 37 may be electrically connected to a central portion of the variable resistance layer 41(VR) (e.g., the MTJ structure MTJ). The second active source contact 37 may be shifted by a second wiring structure WRS2-2 including a second lower via/wiring layer 44, 48, 52, and 56 and a second middle wiring layer 38-2 and electrically connected to the central portion of the variable resistance layer 41-1(VR) through the second middle connection contact 39-2.

The SOT layer 42-1(HM) may be formed on the variable resistance layer 41-1(VR). The SOT layer 42-1(HM) may have the second thickness TK2 as described above. The SOT layer 42(HM) may extend in the first diagonal direction (D1 direction) further than both edges of the variable resistance layer 41-1(VR). For example, as described above, the lower portion of the SOT layer 42 may be connected to the first middle connection contact 39-1.

A source line contact 43-1 may be formed on the SOT layer 42-1 and/or HM. The source line contact 43-1 may include a via layer. The source line contact 43-1 may not vertically overlap the variable resistance layer 41-1 (VR). The source line contact 43-1 may be at an outer side of one edge of the SOT layer 42-1(HM).

The source line contact 43-1 may vertically extend into and come into contact with the SOT layer 42-1(HM). The source line contact 43-1 may be over the second active source contact 37. The source line SL1 may be on the source line contact 43-1. The above-described components on a semiconductor substrate 11 may be insulated from each other by an insulating layer INS.

Figure 15:
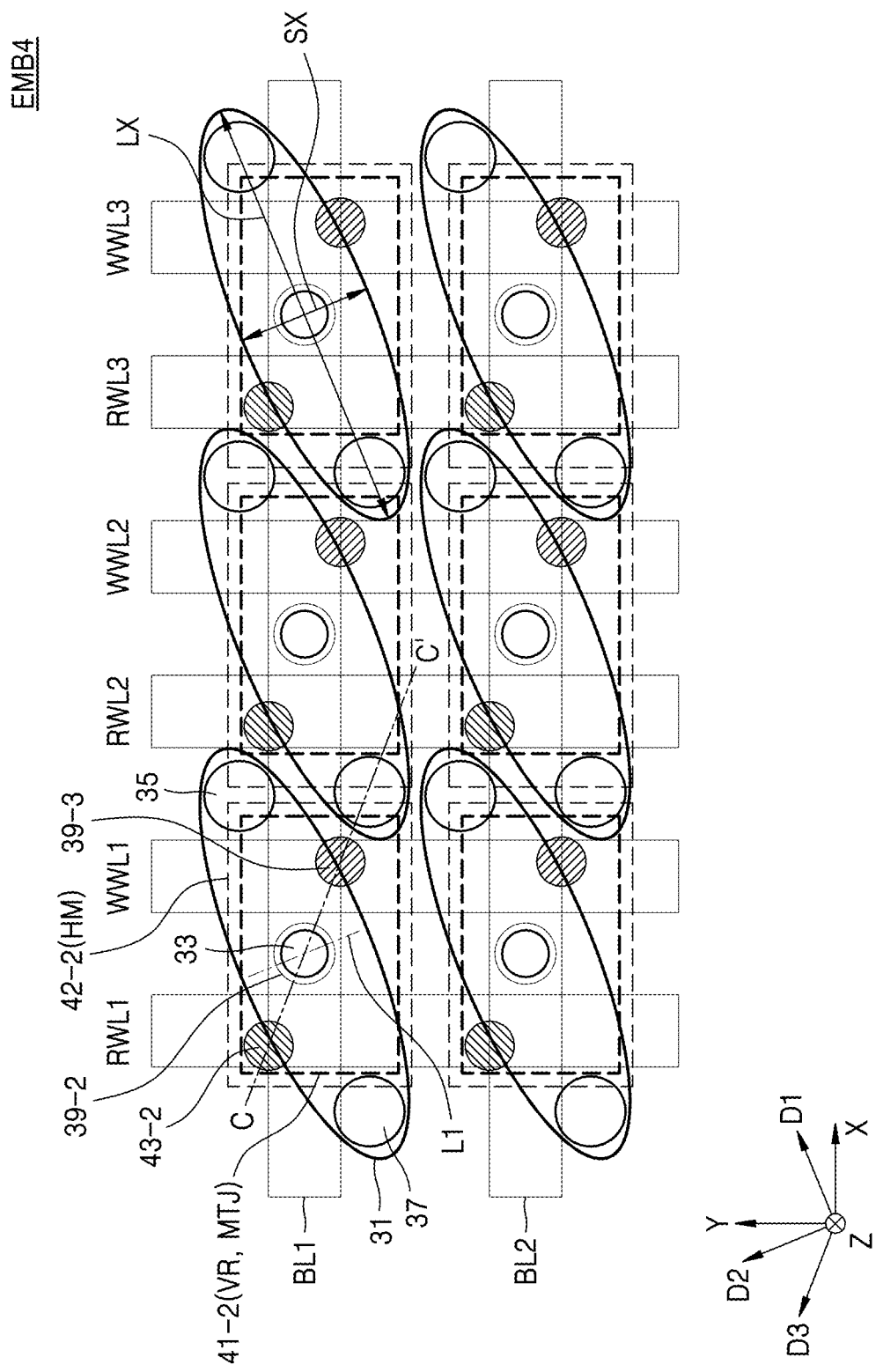
FIGS. 15 and 16 are layout diagrams of a variable resistance memory device according to some embodiments.
Figure 16:
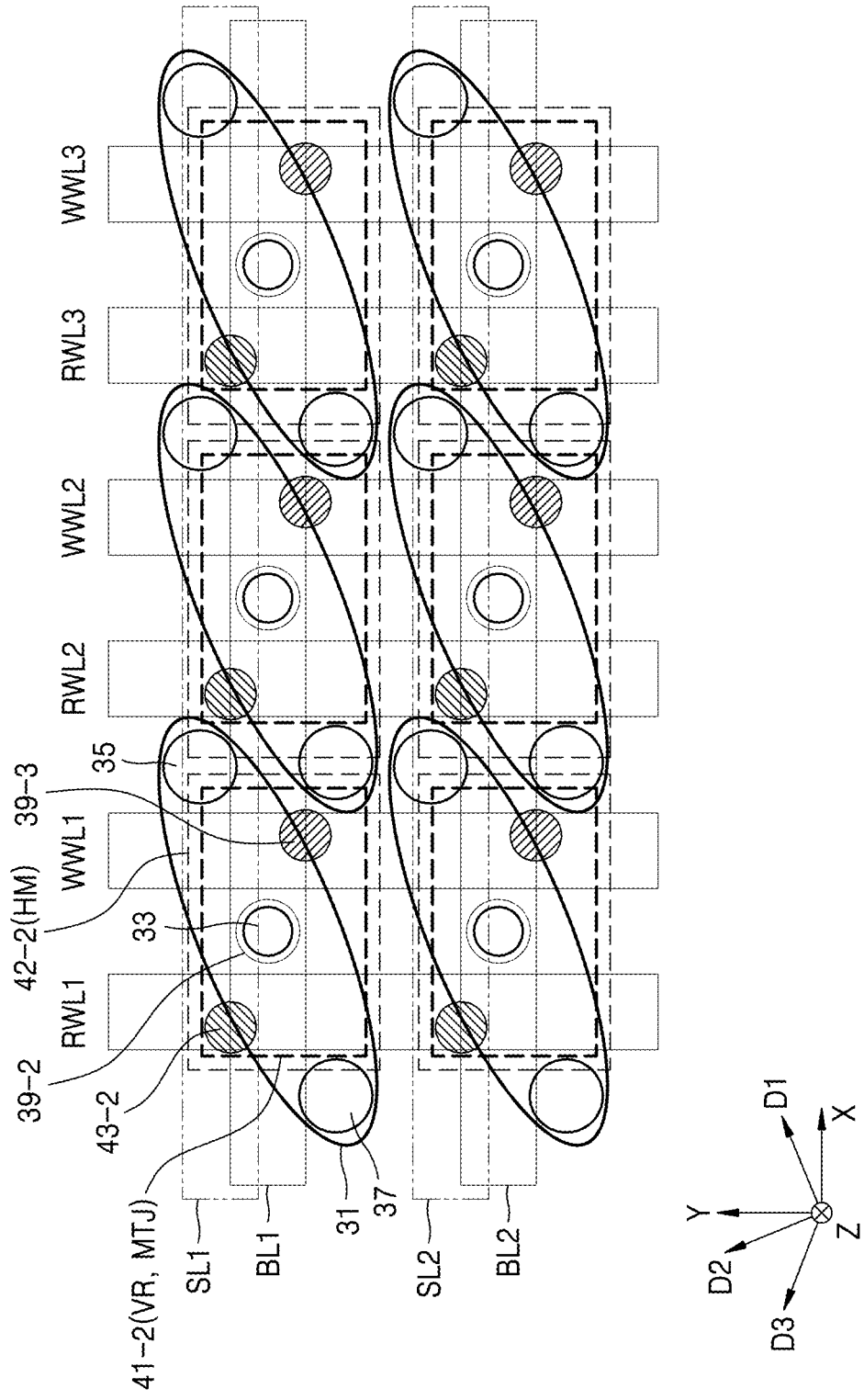

FIGS. 15 and 16 are layouts of a variable resistance memory device according to some embodiments.

FIGS. 15 and 16 illustrate a fourth embodiment EMB4, which implements the variable resistance memory device 100 of FIGS. 1 to 4. The fourth embodiment EMB4 of FIGS. 15 and 16 may be substantially the same as the second embodiment EMB2 of FIGS. 11 to 13 except for the arrangement of first middle connection contacts 39-3 and source line contacts 43-2.

The description of components of FIGS. 15 and 16 that are the same as those of FIGS. 11 to 13 will be omitted or briefly presented. The fourth embodiment EMB4 of FIGS.

15 and 16 may be an example of implementing a stereoscopic view of the variable resistance memory device (refer to 100 in FIG. 1) shown in FIG. 4. A cross-sectional view according to the fourth embodiment EMB4 of FIGS. 15 and 16 is substantially the same as FIG. 13, and thus, the illustration thereof is omitted here.

The active regions 31, the common bit line contacts 33, the first active source contacts 35, and the second active source contacts 37 may be arranged as shown in FIG. 7 above. The arrangement of the active regions 31, the common bit line contacts 33, the first active source contacts 35, and the second active source contacts 37 have been described above, and thus, descriptions thereof are omitted here.

FIG. 15 illustrates the arrangement of a plurality of first middle connection contacts 39-3, a plurality of second middle connection contacts 39-2, a plurality of variable resistance layers 41-2(VR), a plurality of SOT layers 42-2 (HM), and a plurality of source line contacts 43-2. The variable resistance layers 41-2(VR) may be an MTJ structure MTJ of an SOT type.

The plurality of variable resistance layers 41-2 (VR) may be on the active regions 31, the word lines WWL1 to WWL3 and RWL1 to RWL3, and the bit lines BL1 and BL2. In the fourth embodiment EMB4, the variable resistance layers 41-2(VR) may not be defined by the active regions 31. For example, the variable resistance layers 41-2 may be arranged in a matrix form and be apart from each other in a first direction (e.g., the Y direction) and a second direction (e.g., the X direction). As described above, the variable resistance layers 41-2 may be electrically connected to the second active source contacts 37 by the second middle wiring layer (refer to 38-2 in FIG. 13) and the second middle connection contact 39-2.

The plurality of SOT layers 42-2(HM) may be on the variable resistance layers 41-2(VR) over the active regions 31, the word lines WWL1 to WWL3 and RWL1 to RWL3, and the bit lines BL1 and BL2. The SOT layers 42-2(HM) may entirely overlap the variable resistance layers 41-2. As described above, the SOT layers 42-2 or HM may be electrically connected to the first active source contacts 35 through the first middle connection contacts 39-3.

The first middle connection contacts 39-3 may overlap edge portions of the active regions 31. The first middle connection contacts 39-3 may overlap the write word lines WWL1 to WWL3. Source line contacts 43-2 may be on the SOT layers 42 or HM.

The first middle connection contacts 39-3 and the source line contacts 43-2 may be in a second diagonal direction (e.g., the D2 direction) between the first direction (Y direction) and the anti-parallel second direction (e.g., the −X direction). A minor-axis direction SX may correspond to the second diagonal direction (D2 direction).

The first middle connection contacts 39-3 and the source line contacts 43-2 may be further rotated counterclockwise from the second diagonal direction (e.g., the D2 direction) and arranged in line C-C'. The line C-C' may be in a third diagonal direction (e.g., the D3 direction).

For example, the first middle connection contacts 39-3 and the source line contacts 43-2 may be further rotated counterclockwise from line L1, which is in the second diagonal direction (e.g., the D2 direction), and arranged in the line C-C'. The line L1 may correspond to the minor-axis direction SX.

FIG. 16 illustrates the arrangement of the source lines SL1 and SL2. A plurality of source lines SL1 and SL2 may extend in the second direction (e.g., the X direction) on the source line contacts 43-2 and be apart from each other in the first direction (e.g., the Y direction).

The source lines SL1 and SL2 may be electrically connected to the source line contacts 43-2. A vertical connection relationship between the source lines SL1 and SL2 and the source line contacts 43-2 has been described above, and thus, a description thereof is omitted here.

Figure 17:
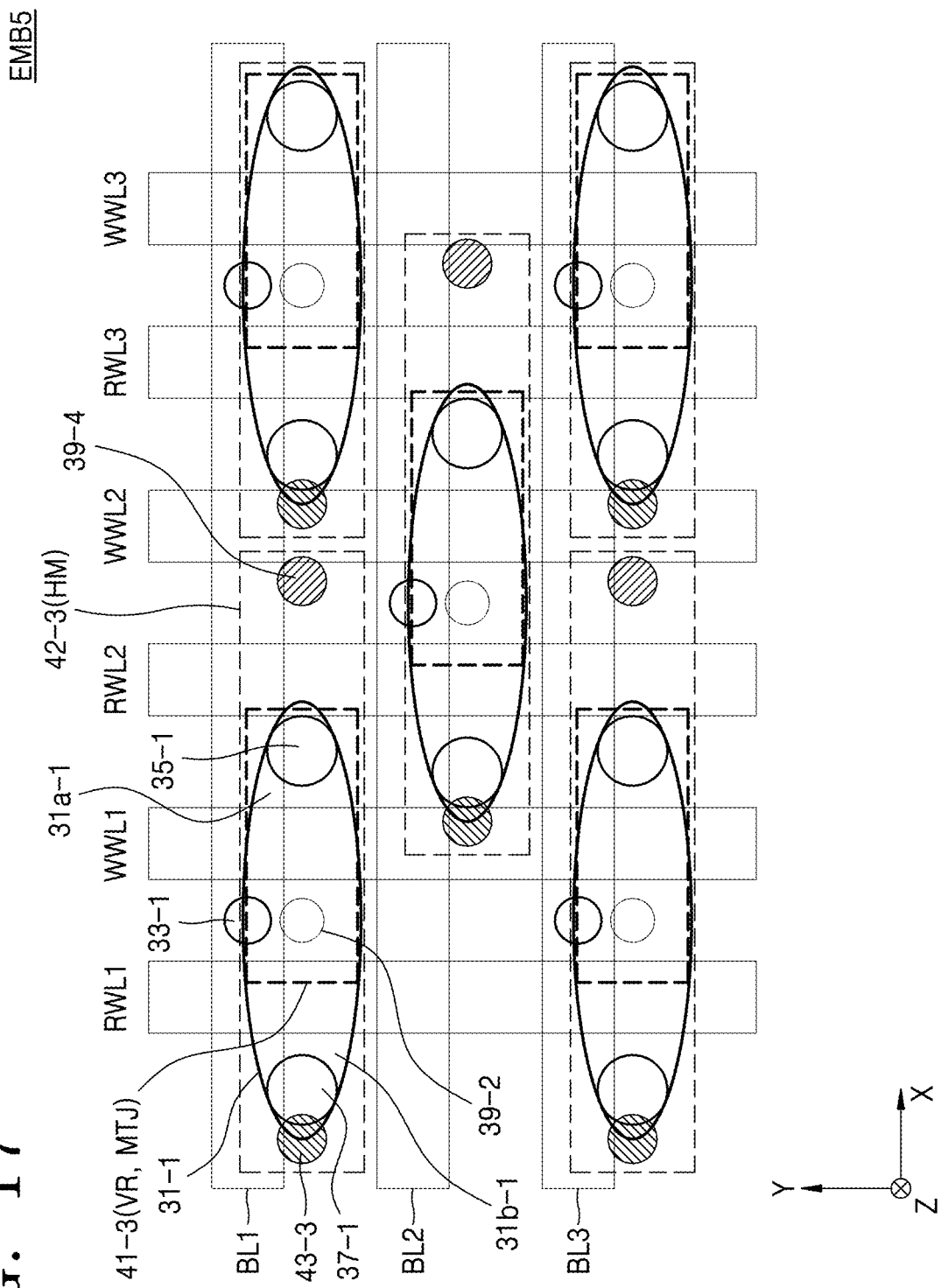
FIGS. 17 and 18 are layout diagrams of a variable resistance memory device according to some embodiments.
Figure 18:
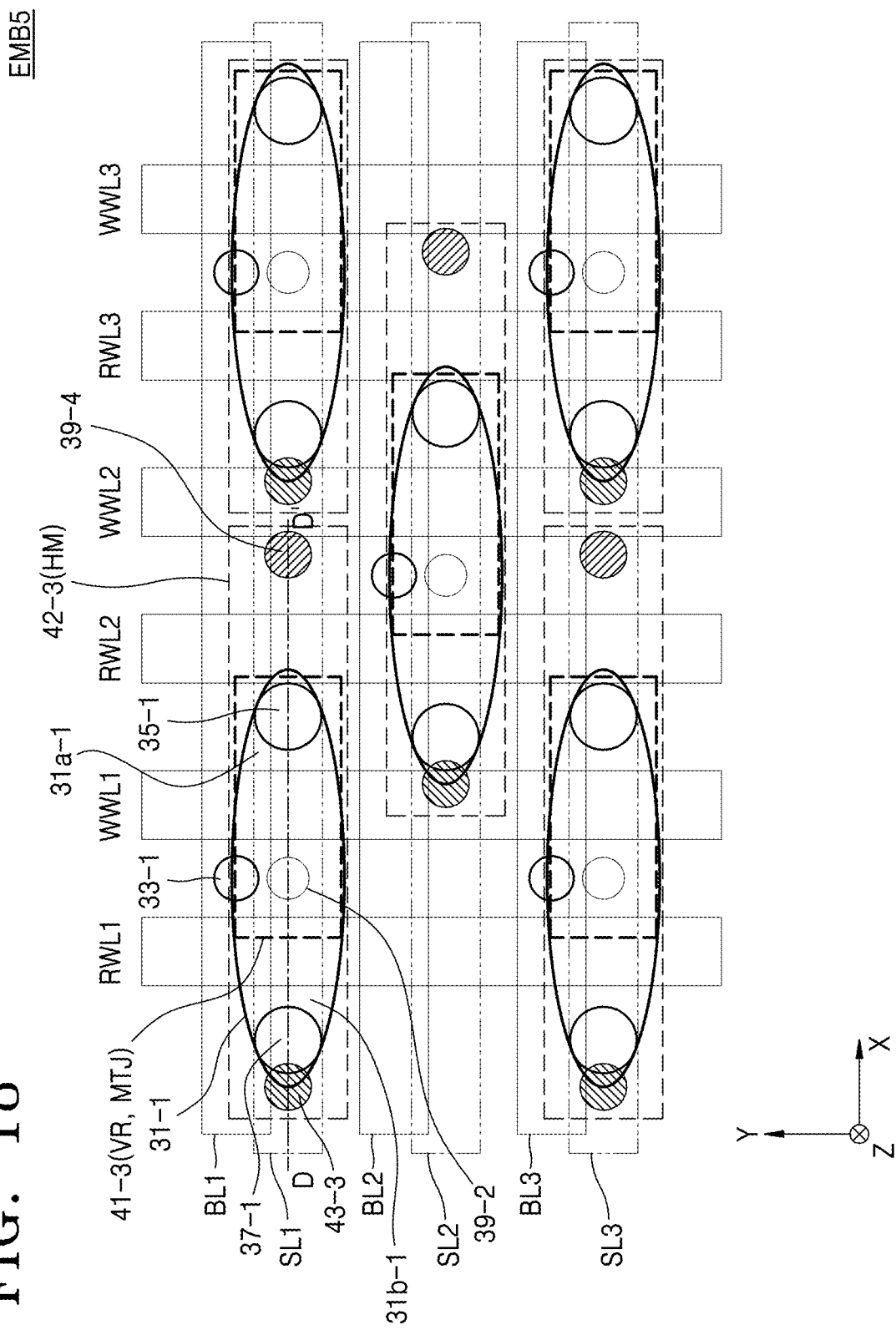

FIGS. 17 and 18 are layout diagrams of a variable resistance memory device according to some embodiments.

FIGS. 17 and 18 illustrate a fifth embodiment EMB5, which implements the variable resistance memory device 100 of FIGS. 1 to 4. the fifth embodiment EMB5 of FIGS. 17 and 18 may be substantially the same as the second embodiment EMB2 of FIGS. 10 to 13 except for the arrangement of active regions 31-1, common bit line contacts 33-1, and first middle connection contacts 39-4.

For example, in the fifth embodiment EMB5, the active regions 31-1 may extend in a second direction (e.g., the X direction), the common bit line contacts 33-1 may be in edge portions of the active regions 31-1, and the first middle connection contacts 39-4 may be outside the active regions 31-1. The description of components of FIGS. 17 and 18 that are the same as those of FIGS. 10 to 13 will be omitted or briefly presented.

FIG. 17 illustrates the arrangement of the active regions 31-1, the common bit line contacts 33-1, the first active source contacts 35-1, and the second active source contacts 37-1. As shown in FIG. 17, a plurality of active regions 31-1 may be arranged on a semiconductor substrate (not shown) and apart from each other in a first direction (e.g., the Y direction) and the second direction (e.g., the X direction), which is perpendicular to the first direction (e.g., the Y direction). The active regions 31-1 may be arranged in a matrix form apart from each other in the first direction (e.g., the Y direction) and the second direction (X direction).

The active regions 31-1 may have an elliptical shape. The active regions 31-1 may extend in the second direction (e.g., the X direction). In other words, the active regions 31-1 may be perpendicular to the first direction (e.g., the Y direction) and parallel to the second direction (e.g., the X direction).

A plurality of the common bit line contacts 33-1 may be in edge portions near to central portions of the active regions 31-1. A plurality of the first active source contacts 35-1 may be on first active regions 31a-1 near one edge of each of the common bit line contacts 33, from among the active regions 31-1. A plurality of second active source contacts 37-1 may be on second active regions 31b-1 near another edge of each of the common bit line contacts 33-1, from among the active regions 31-1.

A plurality of the word lines WWL1 to WWL3 and RWL1 to RWL3 may extend in the first direction (e.g., the Y direction) to be apart from each other in the second direction (e.g., the X direction) between the first active source contacts 35-1 and the common bit line contacts 33-1 and between the common bit line contacts 33-1 and the second active source contacts 37-1. The word lines WWL1 to WWL3 and RWL1 to RWL3 may include write word lines WWL1 to WWL3 and read word lines RWL1 to RWL3.

A plurality of bit lines BL1 and BL2 may extend in the second direction (e.g., the X direction) on the common bit line contacts 33-1 and be apart from each other in the first direction. The first active source contacts 35-1 and the second active source contacts 37-1 may be apart from each other in the first direction (e.g., the Y direction) and sequentially arranged between the read word lines RWL1 to RWL3 and the write word lines WWL1 to WWL3.

In addition, FIG. 17 illustrates the arrangement of a plurality of first middle connection contacts 39-4, a plurality of second middle connection contact 39-2, a plurality of variable resistance layers 41-3(VR), a plurality of SOT layers 42-3(HM), and a plurality of source line contacts 43-3.

Each of the variable resistance layers 41-3(VR) may be an MTJ structure MTJ of an SOT type. The plurality of variable resistance layers 41-3(VR) may be on the active regions 31-1, the word lines WWL1 to WWL3 and RWL1 to RWL3, and the bit lines BL1 and BL2 and electrically connected to the second active source contacts 37-1. The variable resistance layers 41-3 may overlap portions of the active regions 31-1. In a top view, the variable resistance layers 41-3 may have a smaller area than an area of the active regions 31-1 and overlap the active regions 31-1.

The plurality of SOT layers 42-3(HM) may be on the variable resistance layers 41-3(VR) over the active regions 31-1, the word lines WWL1 to WWL3 and RWL1 to RWL3, and the bit lines BL1 and BL2 and electrically connected to the first active source contacts 35-1 through the first middle connection contacts 39-4. In a top view, the SOT layers 42-3(HM) may have a larger area than an area of the active regions 31-1 and overlap the active regions 31-1.

The first middle connection contacts 39-4 may be at an outer side of edges of the active regions 31-1. A vertical connection relationship between the first active source contacts 35-1 and the SOT layers 42-3(HM) by using the first middle connection contacts 39-4 will be described in detail below.

The second middle connection contact 39-2 may be in a central portion of a variable resistance layer 41-3(VR). The second middle connection contact 39-2 may be electrically connected to the second active source contacts 37-1. A vertical connection relationship between the second active source contacts 37 and the variable resistance layer 41-1 (VR) by using the second middle connection contact 39-2 will be described in detail below.

The source line contacts 43-3 may be on the SOT layers 42-3(HM) that are on the second active source contacts 37-1. The first middle connection contacts 39-4 and the source line contacts 43-3 may be sequentially in the second direction (e.g., the X direction) between the bit lines BL1 to BL3.

FIG. 18 illustrates the arrangement of the source lines SL1 and SL2. On the source line contacts 43-3, a plurality of source lines SL1 and SL2 may extend in the second direction (X direction) and be apart from each other in the first direction (e.g., the Y direction). The source lines SL1 and SL2 may be electrically connected to the source line contacts 43-3. A vertical connection relationship between the source lines SL1 and SL2 and the source line contacts 43-3 will be described in detail below.

Figure 19:
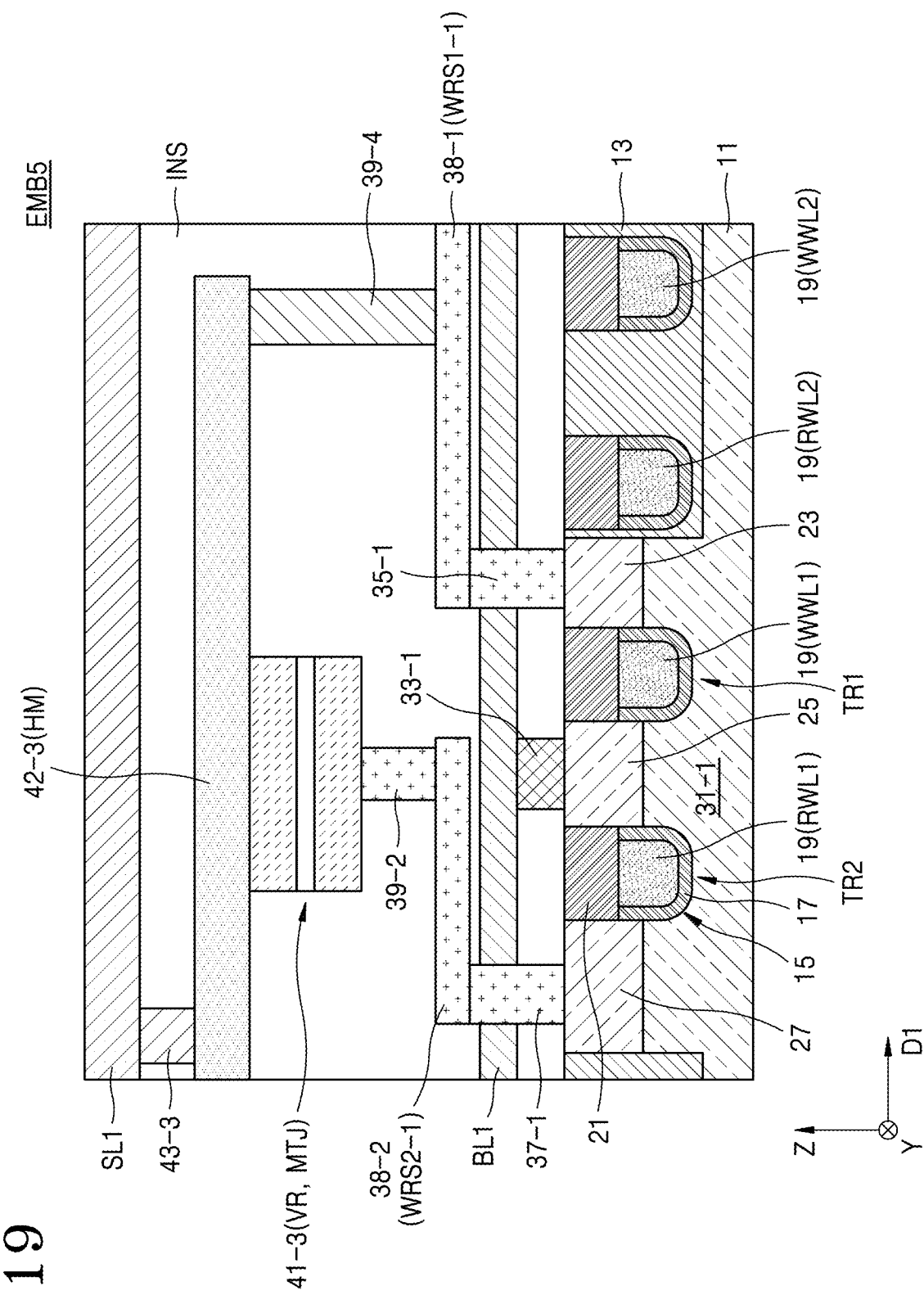
FIG. 19 is a cross-sectional view of the variable resistance memory device taken along line D-D' of FIG. 18.

FIG. 19 is a cross-sectional view of the variable resistance memory device 100, which is taken along line D-D' of FIG. 18.

Specifically, FIG. 19 may be substantially the same as FIG. 10 except that an SOT layer 42-3 extends long in the second direction (e.g., the X direction), and thus, a second middle connection contact 39-4 is formed on a non-active region 13. Although FIG. 19 is the cross-sectional view taken along line D-D' of FIG. 18, FIG. 19 may further include some components, which are not taken along line D-D' of FIG. 18, for brevity. The description of components of FIG. 19 that are the same as those of FIGS. 10 to 13 will be omitted or briefly presented.

The fifth embodiment EMB5 of FIG. 19 may be an example of implementing a stereoscopic view of the variable resistance memory device (refer to 100 in FIG. 1) shown in FIG. 4. In the fifth embodiment EMB5, the variable resistance memory device (refer to 100 in FIG. 1) may include an active region 31-1, a first source/drain region 23, a second source/drain region 25, and a third source/drain region 27.

A first active source contact 35-1 and a second active source contact 37-1 may be respectively formed on the first source/drain region 23 and the third source/drain region 27. A common bit line contact 33-1 may be formed on the second source/drain region 25.

The first active source contact 35-1 may be electrically connected to a lower portion of the SOT layer 42-3(HM). The first active source contact 35-1 may be electrically connected to the lower portion of the SOT layer 42-3(HM) through a first middle wiring layer 38-1 and a first middle connection contact 39-4. The first active source contact 35-1 may be shifted by the first middle wiring layer 38-1 (e.g., a first wiring structure WRS1-1) and electrically connected to the SOT layer 42-3(HM) through the first middle connection contact 39-4.

The second active source contact 37-1 may be electrically connected to the central portion of the variable resistance layer 41-3(VR) (e.g., the MTJ structure MTJ). The second active source contact 37-1 may be shifted by the second middle wiring layer 38-2 (e.g., a second wiring structure WRS2-1) and electrically connected to the central portion of the variable resistance layer 41-3(VR) through the second middle connection contact 39-2.

The SOT layer 42-3(HM) may be formed on the variable resistance layer 41-3(VR). The SOT layer 42-3(HM) may extend to a non-active region 13 of a semiconductor substrate 11. The SOT layer 42-3(HM) may extend in the second direction (e.g., the X direction) further than both edges of the variable resistance layer 41-3(VR). For example, as described above, the lower portion of the SOT layer 42-3(HM) may be connected to the first middle connection contact 39-4.

A source line contact 43-3 may be formed on the SOT layer 42-3(HM). The source line contact 43-3 may be a via layer. The source line contact 43-3 may not vertically overlap the variable resistance layer 41-3(VR). The source line contact 43-3 may be over the second active source contact 37-1. The source line SL1 may be on the source line contact 43-3. The above-described components on the semiconductor substrate 11 may be insulated from each other by an insulating layer INS.

Figure 20:
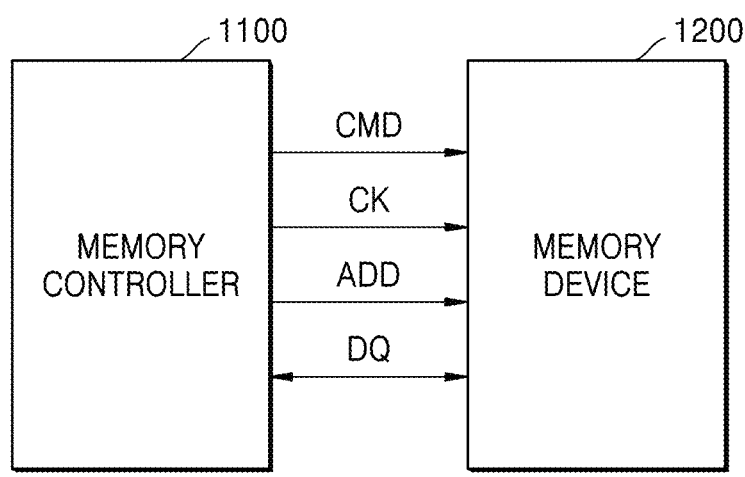
FIG. 20 is a block diagram of a semiconductor memory system including a variable resistance memory device, according to some embodiments.

FIG. 20 is a block diagram of a semiconductor memory system including a variable resistance memory device according to some embodiments.

Specifically, a semiconductor memory system 1000 may include a memory controller 1100 and a memory device 1200. The memory controller 1100 may provide various signals (e.g., a command signal CMD, a clock signal CK, an address signal ADD, and/or a data signal DQ) for controlling the memory device 1200 to the memory device 1200.

In addition, the memory controller 1100 may communicate with the memory device 1200 and provide data signal DQ to the memory device 1200 or receive a data signal DQ from the memory device 1200. The memory device 1200 may include the variable resistance memory device 100 (e.g., a magneto-resistive memory device) described above.

Figure 21:
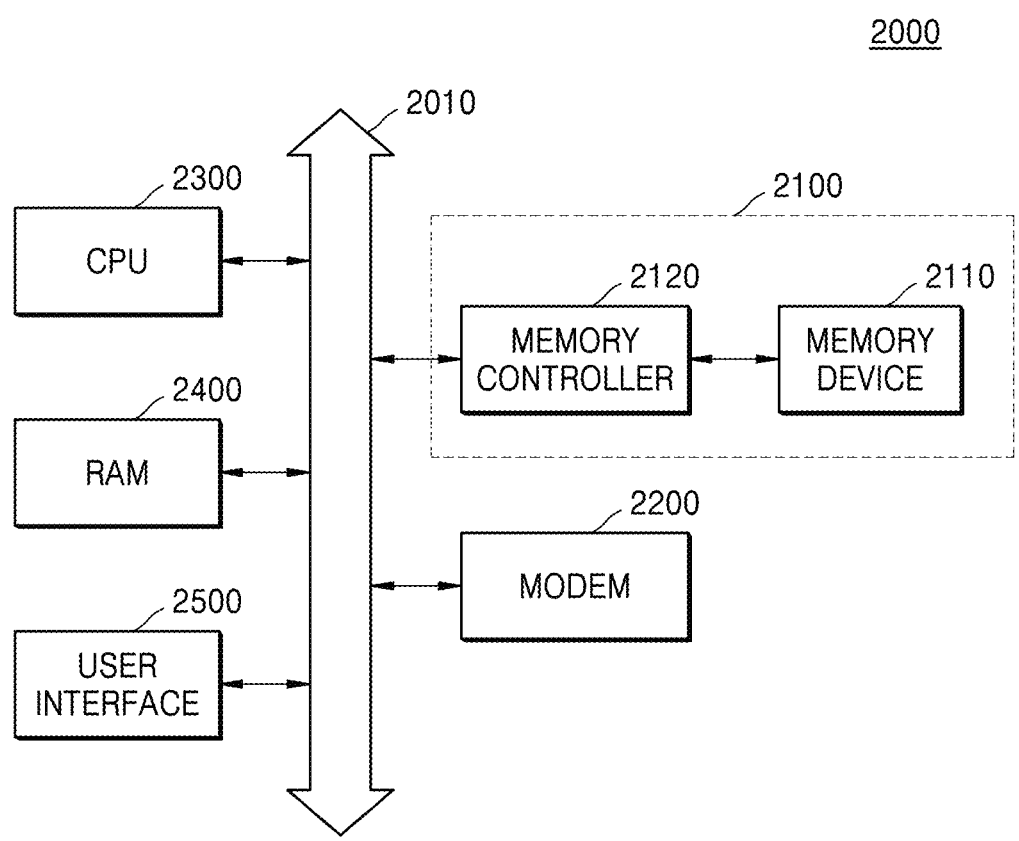
FIG. 21 is a block diagram of an information processing system including a variable resistance memory device according to some embodiments.

FIG. 21 is a block diagram of an information processing system 2000 including a variable resistance memory device, according to some embodiments.

For example, the information processing system 2000 may include a memory system 2100, a modem 2200, a central processing unit (CPU) 2300, random access memory (RAM) 2400, a user interface 2500, and/or the like, which are electrically connected to a bus 2010. The memory system 2100 may include a memory device 2110 and a memory controller 2120. Data processed by the CPU 2300 or data input from the outside may be stored in the memory system 2100.

At least one of the memory system 2100, the memory device 2110, the RAM 2400 may include the variable resistance memory device 100 according to, e.g., any one of the example embodiments described above.

The information processing system 2000 may be used for portable computers, web tablets, wireless phones, mobile phones, digital music players, memory cards, MPEG-1 audio layer 3 (MP3) players, navigations, portable multimedia players (PMPs), solid-state disks (SSDs), household appliances, and/or the like.

While the inventive concepts have been particularly shown and described with reference to some example embodiments thereof, it will be understood that various changes in form and details may be made therein without departing from the spirit and scope of the following claims.

What is claimed is:

1. A variable resistance memory device comprising:
a plurality of active regions spaced apart from each other in a first direction and a second direction;
a plurality of first active source contacts on first ends of the plurality of active regions;
a plurality of second active source contacts on second ends of the plurality of active regions;
a plurality of bit lines extending in the second direction, the plurality of bit lines including at least a first bit line between a row of the plurality of first active source contacts and a row of the plurality of second active source contacts;
a plurality of common bit line contacts electrically connecting central portions or central edges of the plurality of active regions with the plurality of bit lines;
a plurality of word lines extending in the first direction, the plurality of word lines including at least a first word line between a column of the plurality of first active source contacts and a column of the plurality of common bit line contacts and at least a second word line between the column of the plurality of common bit line contacts and a column of the plurality of the second active source contacts;
a plurality of variable resistance layers over the plurality of active regions, the plurality of word lines, and the plurality of bit lines, the plurality of variable resistance layers electrically connected to the plurality of second active source contacts;
a plurality of spin-orbit torque (SOT) layers on the plurality of variable resistance layers and over the plurality of active regions, the plurality of word lines, and the plurality of bit lines, the plurality of SOT layers electrically connected to the plurality of first active source contacts;
a plurality of source lines extending in the second direction; and
a plurality of source line contacts electrically connecting the plurality of SOT layers and the plurality of source lines.

2. The variable resistance memory device of claim 1, wherein
each of the plurality of variable resistance layer comprises a magnetic tunnel junction (MTJ) structure, and
the MTJ structure comprises an SOT-type MTJ structure.

3. The variable resistance memory device of claim 2, wherein the MTJ structure comprises at least one of a perpendicular MTJ (PMTJ) or an in-plane MTJ (IMTJ).

4. The variable resistance memory device of claim 1, wherein each of the plurality of active regions has an elliptical shape having a major axis and a minor axis.

5. The variable resistance memory device of claim 1, wherein the plurality of active regions are inclined in a diagonal direction between the first direction and the second direction.

6. The variable resistance memory device of claim 1, wherein the plurality of active regions are perpendicular to the first direction and parallel to the second direction.

7. The variable resistance memory device of claim 1, wherein
the plurality of variable resistance layers comprises a plurality of magnetic tunnel junction (MTJ) structures over the plurality of active regions,
the plurality of SOT layers are on the plurality of MTJ structures, and
the plurality of MTJ structures comprise SOT-type MTJ structures.

8. The variable resistance memory device of claim 1, further comprising:
first middle connection structures electrically connected to the plurality of SOT layers; and
first wiring structures between and electrically connecting the first middle connection structures and the plurality of first active source contacts such that electric paths between the plurality of first active source contacts and the plurality of SOT layers are shifted by the first wiring structures.

9. The variable resistance memory device of claim 1, further comprising:
second middle connection structures electrically connected to the plurality of variable resistance layers; and
second wiring structures between and electrically connecting the second middle connection structures and the plurality of second active source contacts such that electrical paths between the plurality of second active source contacts and the plurality of variable resistance layers are shifted by the second wiring structures.

10. The variable resistance memory device of claim 1, wherein the plurality of SOT layers protrude from one side surface of each of the variable resistance layers in a cross-sectional view.

11. A variable resistance memory device comprising:
a plurality of active regions spaced apart from each other in a first direction and a second direction;
a plurality of first active source contacts on first ends of the plurality of active regions;
a plurality of second active source contacts on second ends of the plurality of active regions;
a plurality of bit lines extending in the second direction, the plurality of bit lines including at least a first bit line between a row of the plurality of first active source contacts and a row of the plurality of second active source contacts;
a plurality of common bit line contacts electrically connecting central portions of the plurality of active regions with the plurality of bit lines;
a plurality of word lines extending in the first direction, the plurality of word lines including at least a first word line between a column of the plurality of first active source contacts and a column of the plurality of common bit line contacts and at least a second word line between the column of the plurality of common bit line contacts and a column of the plurality of second active source contacts;
a plurality of first middle connection contacts;
first wiring structures electrically connecting the plurality of first active source contacts and the plurality of first middle connection contacts such that electrical paths between the plurality of first active source contacts and the plurality of first middle connection contacts are shifted by the first wiring structures;
a plurality of second middle connection contacts;
second wiring structures electrically connecting the plurality of second active source contacts and the plurality of second middle connection contacts such that electrical paths between the plurality of second active source contacts and the plurality of second middle connection contacts are shifted by the second wiring structures;
a plurality of variable resistance layers over the plurality of active regions, the plurality of word lines, and the plurality of bit lines, the plurality of variable resistance layers having lower portions electrically connected to the plurality of second middle connection contacts;
a plurality of spin-orbit torque (SOT) layers on the plurality of variable resistance layers and over the plurality of active regions, the plurality of word lines, and the plurality of bit lines, the plurality of SOT layers having lower portions electrically connected to the plurality of first middle connection contacts;
a plurality of source lines extending in the second direction; and
a plurality of source line contacts electrically connecting the plurality of SOT layers and the plurality of source lines.

12. The variable resistance memory device of claim 11, wherein, in a top view, the plurality of source line contacts are between the plurality of first middle connection contacts in the first direction.

13. The variable resistance memory device of claim 11, wherein
one edge portion of each of the plurality of SOT layers is recessed from a corresponding edge portion of each of the plurality of first middle connection contacts in a cross-sectional view, and
another edge portion of each of the plurality of SOT layers is recessed from another corresponding edge of each of the plurality of source line contacts in the cross-sectional view.

14. The variable resistance memory device of claim 11, wherein
the plurality of SOT layers have the same or a larger area than the plurality of active regions and overlap the plurality of active regions in a top view, and
the plurality of variable resistance layers have a smaller area than the plurality of active regions and overlap the plurality of active regions in the top view.

15. A variable resistance memory device comprising: a plurality of word lines extending in a first direction; a plurality of bit lines extending in a second direction; a plurality of source lines extending in the second direction; and a plurality of memory cells spaced apart from each other in the first direction and the second direction, each of the plurality of memory cells comprising an active region, a common bit line contact in a central portion of the active region, the common bit line contact electrically connecting the active region to a bit line of the plurality of bit lines, a first active source contact on the active region such that, in a top view, a first word line, of the plurality of word lines, is between the first active source contact and the common bit line contact, a second active source contact on a second end of the active region such that, in the top view, a second word line, of the plurality of word lines, is between the second active source contact and the common bit line contact, a variable resistance layer over the active region, the first and second word lines, and the bit line, the variable resistance layer electrically connected to the second active source contact, a spin-orbit torque (SOT) layer on the variable resistance layer and over the active region, the first and second word lines, and the bit line, the SOT layer electrically connected to the first active source contact, and a source line contact electrically connecting a source line, of the plurality of source lines, and the SOT layer, wherein the first active source contact is between the second active source contacts of the memory cells adjacent to each other in the second direction, and the second active source contact is between the first source active contacts of the memory cells adjacent to each other in the second direction.

16. The variable resistance memory device of claim 15, wherein
the plurality of word lines comprises a read word line and a write word line,
the first active source contacts are read contacts, and
the second active source contacts are write contacts.

17. The variable resistance memory device of claim 15, wherein
the active region has an elliptical shape with a major axis and a minor axis, and
the active region is inclined in a diagonal direction between the first direction and the second direction.

18. The variable resistance memory device of claim 17, wherein
the first active source contact is on a first end of the active region having the elliptical shape, and
the second active source contact is on a second end of the active region having the elliptical shape.

19. The variable resistance memory device of claim 15, wherein
the variable resistance layer comprises magnetic tunnel junction (MTJ) structures vertically in the active region,
the SOT layer is on the MTJ structure, and
the MTJ structure comprises an SOT-type MTJ structure.

20. The variable resistance memory device of claim 15, wherein
the SOT layer has the same or a larger area than the active region and overlaps the active region in a top view, and
the variable resistance layer has a smaller area than the active region and overlaps the active region in the top view.

* * * * *